(12) United States Patent
Young et al.

(10) Patent No.: US 6,872,896 B1
(45) Date of Patent: Mar. 29, 2005

(54) ELONGATED BRIDGE SHUNT

(75) Inventors: Steven R. Young, Hutchinson, MN (US); Fredrick V. Hayen, Dassel, MN (US); Joshua J. Harmala, Dassel, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 151 days.

(21) Appl. No.: 10/241,745

(22) Filed: Sep. 11, 2002

Related U.S. Application Data

(60) Provisional application No. 60/322,194, filed on Sep. 12, 2001.

(51) Int. Cl.[7] .......................... H01H 1/12; H01H 15/00
(52) U.S. Cl. .................. 200/16 A; 200/16 D; 200/283; 200/292
(58) Field of Search ................................ 200/5 R, 5 A, 200/1 R, 16 A–16 D, 18, 250, 283, 292, 243; 335/2; 361/600–832; 174/250–268

(56) References Cited

U.S. PATENT DOCUMENTS

| | | | | | |
|---|---|---|---|---|---|
| 3,294,927 A | * | 12/1966 | Hill | ............................. | 200/5 R |
| 3,383,487 A | * | 5/1968 | Wiener | ........................... | 335/2 |
| 3,603,075 A | * | 9/1971 | Wolber et al. | ............ | 200/38 R |
| 4,402,131 A | | 9/1983 | Roberts | ....................... | 29/622 |
| 4,559,421 A | | 12/1985 | Lapke et al. | ............... | 200/51.1 |
| 4,870,375 A | | 9/1989 | Krueger, Jr. et al. | .......... | 333/33 |
| 5,465,186 A | | 11/1995 | Bajorek et al. | ............. | 360/113 |
| 5,598,307 A | | 1/1997 | Bennin | ....................... | 360/104 |
| 5,644,454 A | | 7/1997 | Arya et al. | .................. | 360/106 |
| 5,699,212 A | | 12/1997 | Erpelding et al. | ........... | 360/104 |
| 5,710,682 A | | 1/1998 | Arya et al. | ................. | 360/106 |
| 5,712,609 A | | 1/1998 | Mehregany et al. | .......... | 337/70 |
| 5,844,751 A | | 12/1998 | Bennin et al. | ............... | 360/104 |
| 5,877,933 A | | 3/1999 | Johansen et al. | ........... | 361/220 |
| 5,991,121 A | | 11/1999 | Kanda | ........................ | 360/104 |

(Continued)

FOREIGN PATENT DOCUMENTS

| | | |
|---|---|---|
| DE | 198 47 425 A1 | 12/2000 |
| GB | 2343304 | 3/2000 |
| JP | 10-241132 | 9/1998 |
| JP | 11-238218 | 8/1999 |
| JP | 2000-141669 | 5/2000 |
| JP | 2001-84544 | 3/2001 |

OTHER PUBLICATIONS

Hutchinson Technology Inc., "Fold–Over Style Reuseable Electrical Shunt for Integrated Lead Magnetic Head Suspension", Research Disclosure, p. 987, Jun. 2000, 1 page.

*Primary Examiner*—James R. Scott
(74) *Attorney, Agent, or Firm*—Faegre & Benson LLP

(57) ABSTRACT

Structure for forming a switchable shunt for a suspension assembly having conductive, insulating and metal base layers. The shunt includes a bridge in the conductive layer with either a continuous connection or small gap between ends of the bridge. The continuous connection of the bridge is severed either by temporarily moving the lands out of their original plane by stretching and rupturing the bridge or by shearing the continuous connection of the bridge. For the sheared or gapped bridge, at least one end of the bridge is moved out of the plane, compressed and elongated. When released, the separated ends of the bridge overlap and contact each other to form a normally-closed switch. To subsequently open the switchable shunt, at least one of the lands is moved out of plane to physically and electrically open the connection between the separated and overlapped ends of the bridge.

19 Claims, 27 Drawing Sheets

U.S. PATENT DOCUMENTS

| | | | |
|---|---|---|---|
| 6,034,851 A | 3/2000 | Zarouri et al. | 360/137 |
| 6,052,258 A | 4/2000 | Albrecht et al. | 360/104 |
| 6,075,676 A | 6/2000 | Hiraoka et al. | 360/104 |
| 6,163,443 A | 12/2000 | Hatagami et al. | 360/323 |
| 6,181,527 B1 | 1/2001 | Contreras et al. | 360/246 |
| 6,275,361 B1 | 8/2001 | Wallash et al. | 360/323 |
| 6,307,467 B1 | 10/2001 | Starkey et al. | 340/438 |
| 6,402,921 B1 | 6/2002 | Ahn et al. | 205/70 |
| 6,518,521 B1 | 2/2003 | Marek et al. | 200/16 D |
| 6,723,931 B2 * | 4/2004 | Marek et al. | 200/283 |

* cited by examiner

ELONGATED BRIDGE SHUNT

CROSS REFERENCE TO RELATED APPLICATION

This application claims the benefit of U.S. Provisional Patent Application titled FRANGIBLE BRIDGE SHUNT, Ser. No. 60/322,194, filed Sep. 12, 2001.

FIELD OF THE INVENTION

The present invention relates generally to electrical shunts in integrated lead suspensions and flex circuits.

BACKGROUND OF THE INVENTION

Integrated lead suspensions and components (such as flexures) for supporting read and/or write heads in disk drives are well known and in widespread use. So-called "subtractive" type integrated lead suspensions and associated methods for manufacturing the suspensions from multilayer sheets of material are disclosed, for example, in the Bennin et al. U.S. Pat. Nos. 5,598,307 and 5,844,751. However, it is to be understood that "additive" processes are well known, and are equally adaptable to the present invention, and are within the scope of the claims.

Magneto restrictive (MR) and giant magneto restrictive (GMR) heads are commonly mounted to the suspensions. Heads of these types are very sensitive to damage due to "blown fuse" syndrome and electrostatic discharges (ESD). To minimize this damage, the leads of the heads themselves and/or the integrated leads on the suspensions can be electrically shunted (i.e., interconnected or shorted) during manufacturing operations. The stainless steel (i.e., spring metal) layer of the suspension or flexure also is sometimes electrically interconnected to one of the integrated leads to couple the stainless steel layer to ground potential.

It is sometimes necessary to conduct tests of the integrated leads and/or the heads. Any shunts on the leads must typically be removed before the tests can be performed. The leads and heads must be reshunted following the tests if it is again desired to protect the heads from damage. A number of approaches for shunting and reshunting MR and GMR heads, or otherwise electrically coupling the leads to the stainless steel layer during the various stages of the head suspension assembly manufacturing operations are known and disclosed, for example, in the following references.

| Inventor | Document No. |
| --- | --- |
| Bajorek et al. | U.S. Pat. No. 5,465,186 |
| Arya et al. | U.S. Pat. No. 5,710,682 |
| Johansen et al. | U.S. Pat. No. 5,877,933 |
| Kanda | U.S. Pat. No. 5,991,121 |
| Zarouri et al. | U.S. Pat. No. 6,034,851 |
| Albrecht et al. | U.S. Pat. No. 6,052,258 |
| Hiraoka et al. | U.S. Pat. No. 6,075,676 |
| Yim et al. | U.K. 2,343,304 |

There remains a continuing need for improved shunts. To be commercially viable, the shunts should be efficient to manufacture and use. Shunts which can be conveniently reused would be especially desirable.

DETAILED DESCRIPTION

Figure 1:
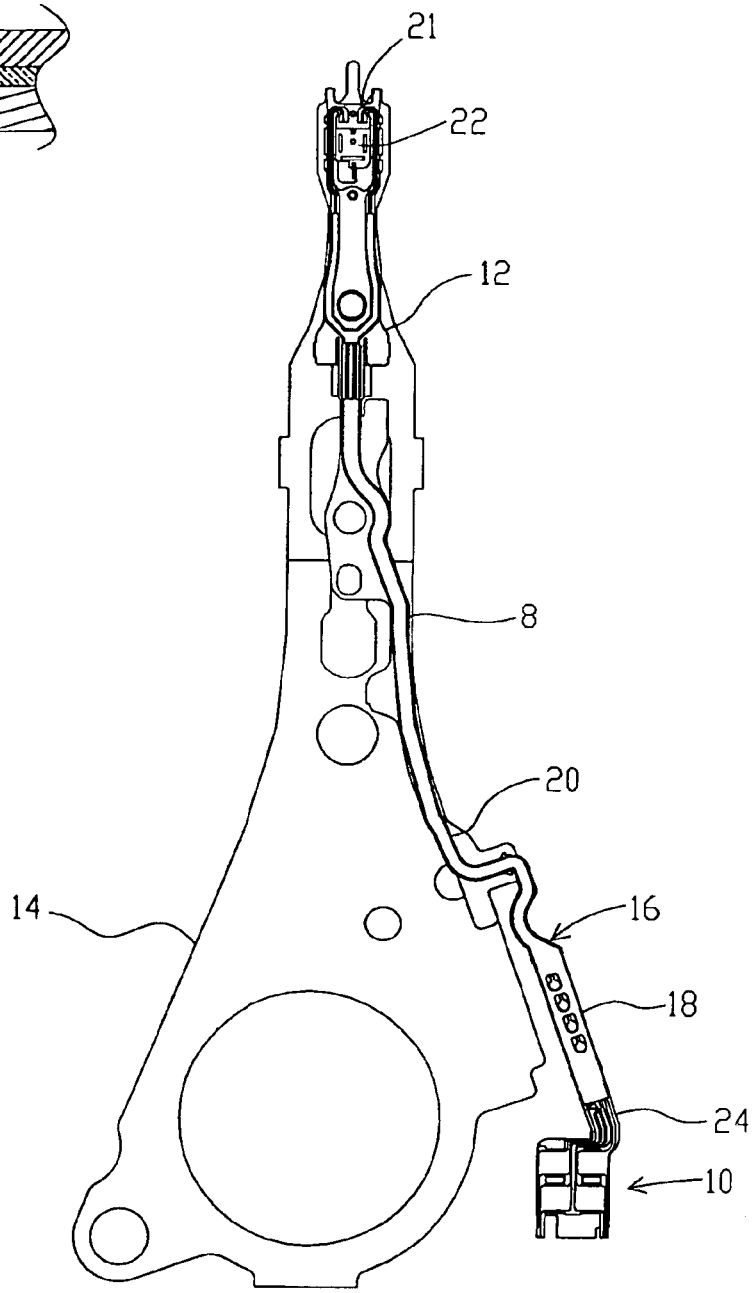
FIG. 1 is a top view of a disk drive head suspension with an integrated lead flexure having a shunt in accordance with the present invention.

A suspension flexure 8 (i.e., a suspension component) which includes a plurality of shunts 10 in accordance with a first embodiment of the present invention is illustrated in FIG. 1. In the embodiment shown, the flexure 8 is an integrated lead-type component which is manufactured as a separate unit and mounted to a load beam 12. The load beam 12 is shown mounted to an actuator arm 14. Even though the present invention is shown and described with respect to a structure that has a flexure separate from a load beam, the present invention is applicable to those designs where the function of the flexure and load beam are performed by a single component, typically called a load beam.

Shunts 10 are located on a tail 16 at the proximal end of the flexure 8. Also located on the tail 16 are terminal pads 18. Each terminal pad 18 is connected to an integrated lead section 20 which extends from the terminal pad to head terminals 21 at a head slider mounting region 22 on a distal end of the flexure 8. Although not shown, head sliders having magneto restrictive (MR) or other heads will be mounted to the slider mounting region 22 and electrically connected to the head terminals 21. Each of the shunts 10 is electrically connected to one of the terminal pads 18 by a second integrated lead section 24.

Figure 2:
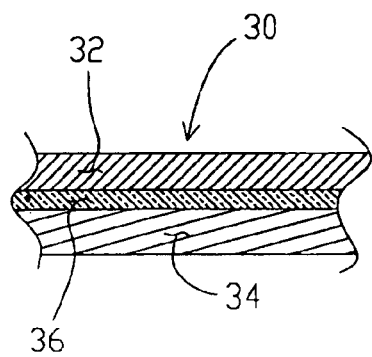
FIG. 2 is a side view of a portion of a multilayer sheet of material from which the shunt shown in FIG. 1 can be manufactured.

FIG. 2 is a cross sectional view of a portion of a multilayer sheet of material 30 from which the flexure 8 and shunts 10 can be manufactured. The sheet of material 30 includes a copper or copper alloy layer 32 (i.e., a conductor layer) and a stainless steel layer 34 (i.e., a spring metal layer) separated by a polyimide layer 36 (i.e., an insulator layer). As described in greater detail below, certain electrical signal-conducting features of the flexure 8 and shunts 10, including the integrated leads 20 and 24, are formed in the copper alloy layer 32. Certain structural features of the flexure 8 and shunts 10, including the head slider mounting region 22 and a base of the shunts, are formed in the stainless steel layer 34. Polyimide layer 36 is formed into sections which electrically isolate signal-conducting features in the copper alloy layer 32 from each other and from the stainless steel layer 34. Conventional or otherwise known photolithographic and etching techniques can be used to form the flexure 8 and shunts 10 from multilayer sheets of material 30. It is to be understood that selected areas of each of the layers 32, 34, and 36 can be removed from the multilayer or laminate 30 by known subtractive chemical etching processes. Although described with respect to a subtractive process, the present invention is equally applicable to additive processes and multilayer laminates formed thereby, as well as approaches that use both additive and subtractive steps. By "additive" is meant approaches where copper and dielectric layers are built up on a substrate such as stainless steel. Furthermore, the present invention is applicable to "flex circuit" constructions which do not typically have a stainless steel layer. Flex circuits typically will have either no layer in place of the stainless steel layer, or, in some instances, a copper layer for an additional conductor layer in place of the stainless steel layer.

Figure 3:
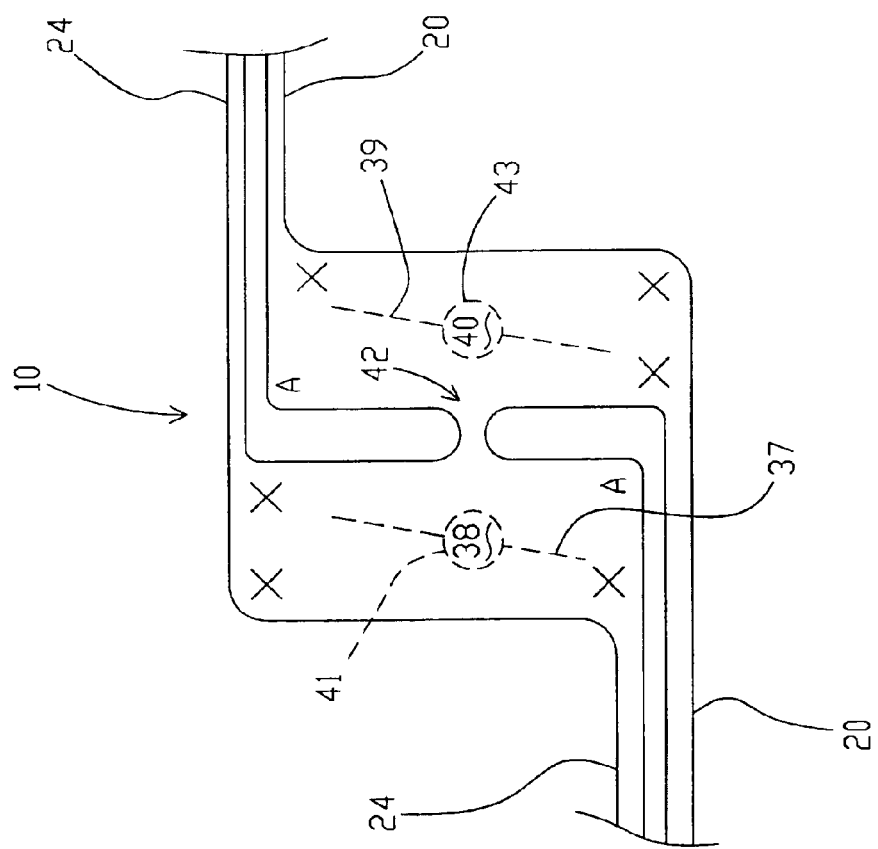
FIG. 3 is a plan view of a pair of lands connected by a bridge in a conductive lead layer suitable for the practice of the present invention in an integrated lead suspension.

FIG. 3 is an enlarged plan view of a shunt 10 in accordance with the present invention. Shunt 10 preferably includes a pair of lands 38, 40 connected together by a bridge 42 of reduced width. Bridge may alternately or additionally be formed by a reduced thickness region between the lands. As a still further alternative, the bridge may include perforations or other such features to aid in the process of forming a switchable shunt. As shown in FIG. 3, each of the lands 38, 40 is connected to a respective integrated lead 20 or 24. Typically, leads 20 and 24 are connected to a read head via terminals 21. As will be described in more detail infra, the lands 38, 40 are preferably supported in "X" areas and unsupported in "A" areas, resulting in lands 38, 40 moving out of plane generally along the dashed hinge lines 137, 139 as the bridge is formed when pins contact the lands 38 and 40 at the locations indicated by the dashed circles 141, 143.

Figure 4:
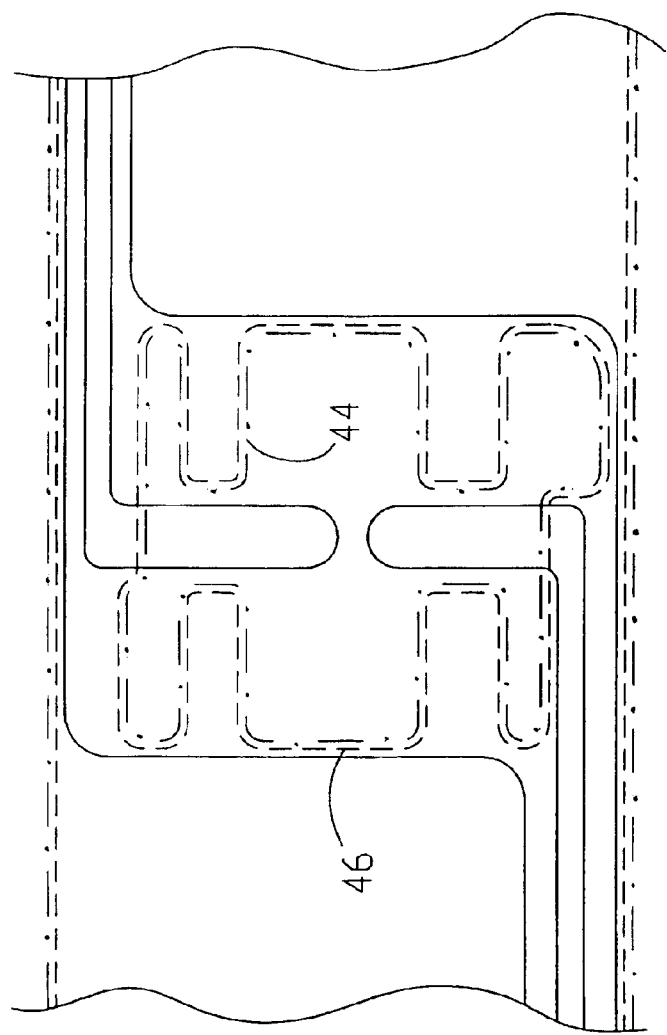
FIG. 4 is an overlay of the lands and bridge of FIG. 3, along with phantom outlines of an insulating layer and a spring metal layer supporting the conductive lands.

FIG. 4 shows a plan view of the shunt 10 with the conductive trace layer 32 containing lands 38, 40 and traces 20, 24, along with the polyimide layer 36 shown in phantom having a pattern formed therein according to the dot-dash line 44. The pattern of the stainless steel layer 34 is shown in phantom by dashed line 46.

Figure 5:
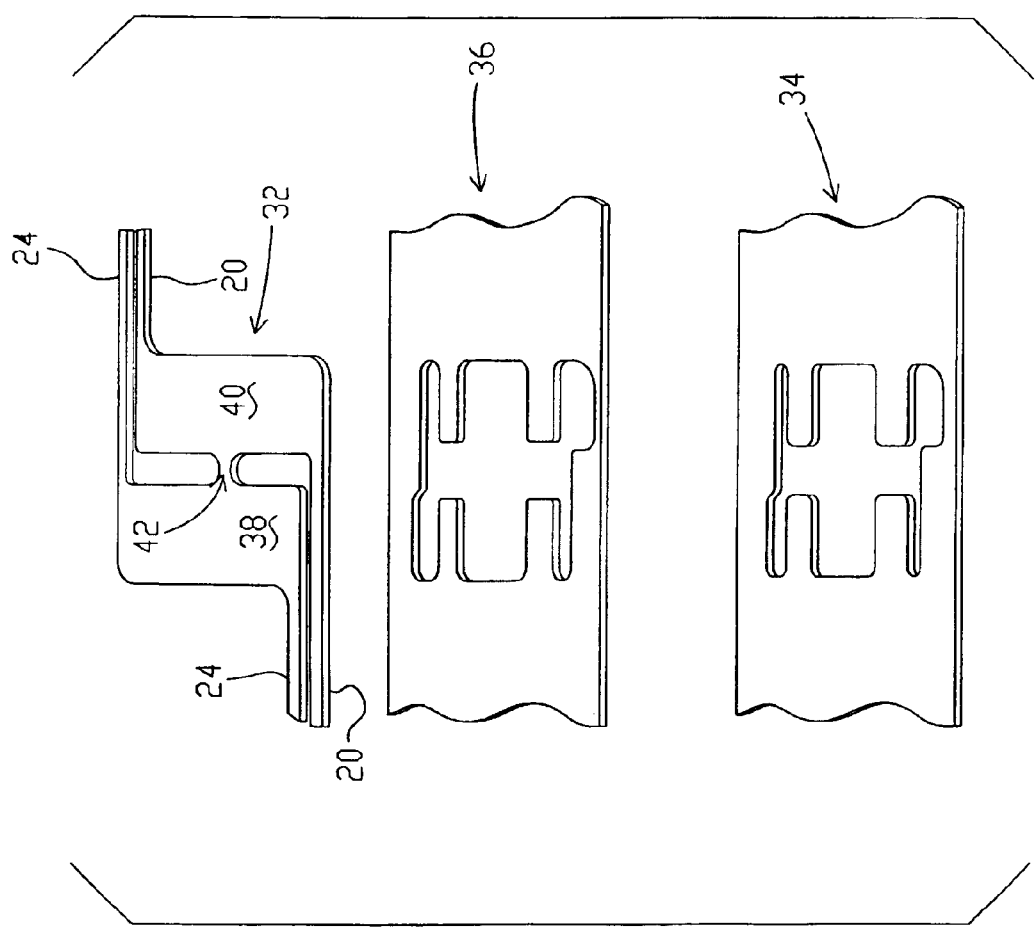
FIG. 5 is a fragmentary exploded perspective view corresponding to FIG. 4.

FIG. 5 shows an exploded perspective view of the shunt 10 to more clearly show the conductive trace layer 32, the insulator layer 36 and the metal spring layer 34.

Figure 6:
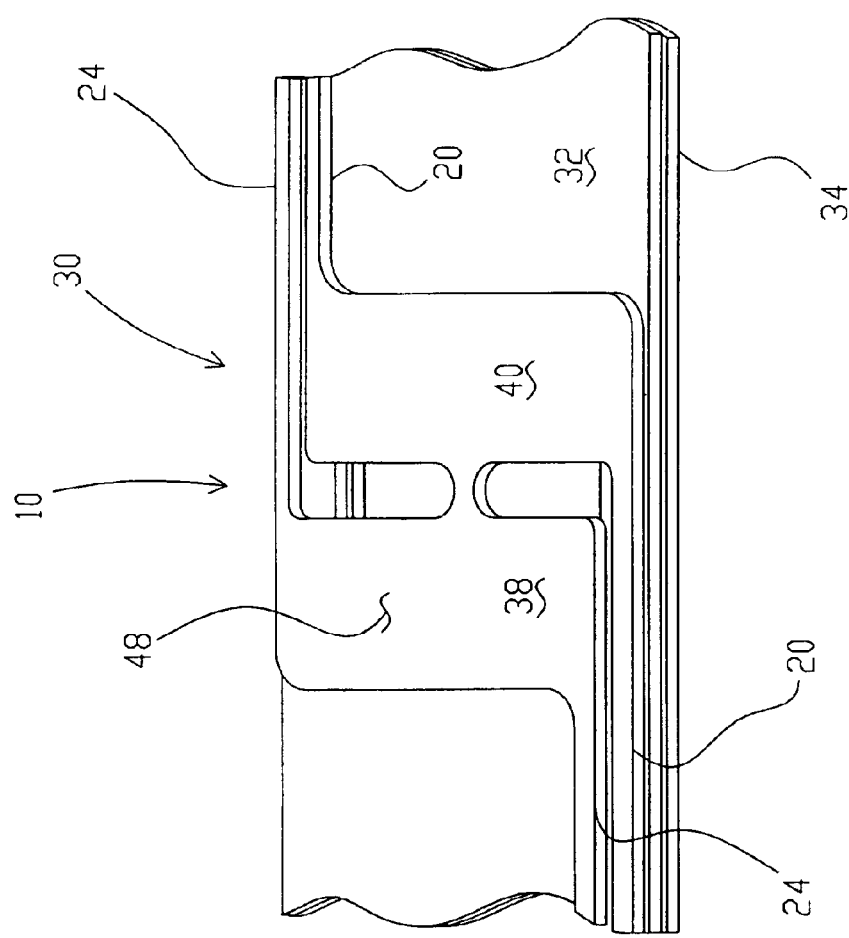
FIG. 6 is a fragmentary perspective view of the assembly of FIG. 4.

FIG. 6 shows the shunt 10 formed in the multilayer assembly 30 in a perspective view.

Figure 7:
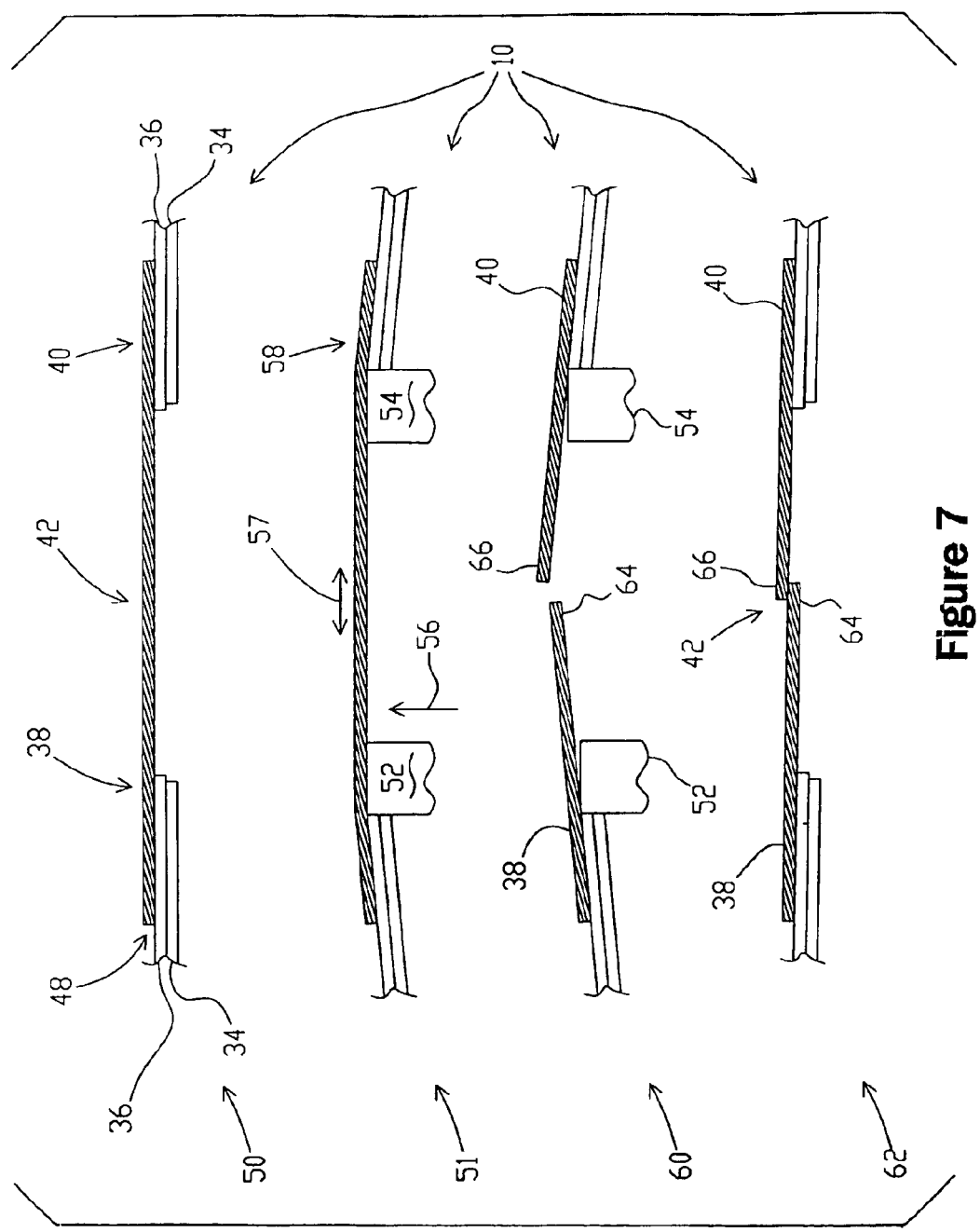
FIG. 7 is a simplified side schematic view of the assembly of FIG. 4, showing the various stages in the formation of the switchable shunt of the present invention.

FIG. 7 shows a simplified side view of the formation of a switchable shunt of the present invention. In a pre-activated state 50, the conductive trace layer has a continuous bridge 42 formed between lands 38, 40 in plane 48. Bridge 42 may take the form of a copper strut or finger interposed between the large copper lands or pads 38 and 40. In the activation state 51, one or more actuating pins 52, 54 are moved against lands 38, 40 with at least a component of motion in a direction 56 generally perpendicular to the plane 48 of the lands. Since the lands 38, 40 are not supported against movement in response to the pins 52, 54, the conductive trace layer lands 38, 40 and the bridge 42 will move out of plane 48, generally forming an arch-like shape 58. Because of the reduced material in the bridge 42 compared to the lands 38, 40, the material forming the bridge will yield initially resulting in plastic elongation in response to the tensile strain indicated by double headed arrow 57. The bridge 42 will subsequently rupture, and result in ruptured ends 64,66 as indicated in the activated open state 60. Once pins 52, 54 are withdrawn, the switchable shunt 10 will move to an activated closed state 62, reconnecting the ruptured ends 64, 66 of the bridge 42, re-establishing the electrical connection between lands 38 and 40 and leads 20 and 24. Subsequently, shunt 10 may be reopened, breaking the electrical connection between lands 38 and 40 and between leads 20 and 24 by engaging one or both lands with a pin moving transverse to plane 48. It is to be understood that pins 52 and 54 may be electrical test probes useful for making electrical connection to lands 38, 40, respectively, to perform electrical tests on the circuitry (such a read head) connected to leads 20, 24. During such testing, it is ordinarily desirable to open the shunt 10. As has been mentioned above, it is further desirable to reclose the shunt 10 after testing, to protect the circuitry or components shunted. It is further to be understood that one or both of pins 52 and 54 may serve as electrical test connections to one or both of leads 20 and 24 whether or not test pads are present.

Figure 11:
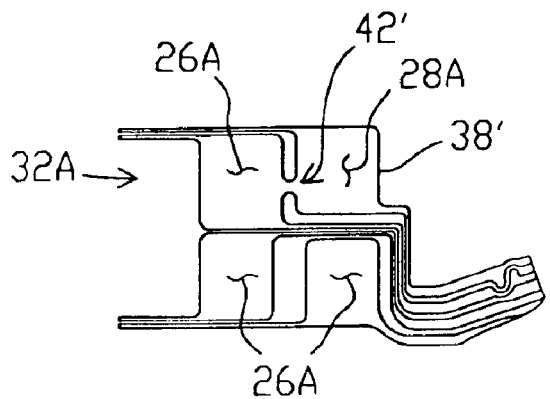
FIG. 11 is a first layer of the embodiment of FIG. 8.
Figure 12:
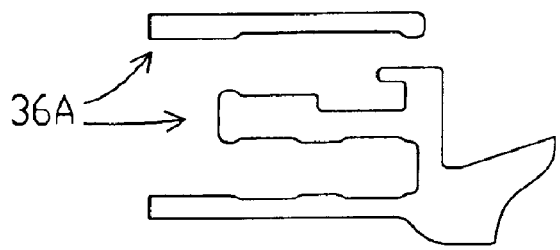
FIG. 12 is a second layer of the embodiment of FIG. 8.
Figure 13:
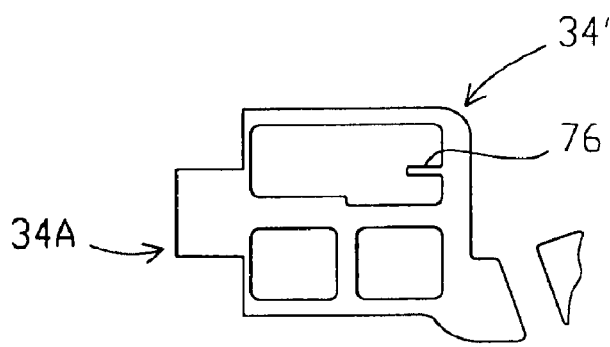
FIG. 13 is a third layer of the embodiment of FIG. 8.
Figure 8:
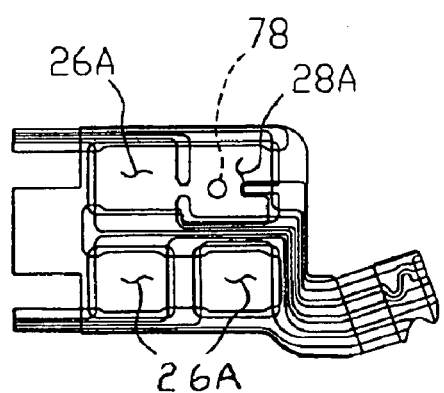
FIG. 8 is an alternative embodiment showing an overlay of the present invention.
Figure 14:
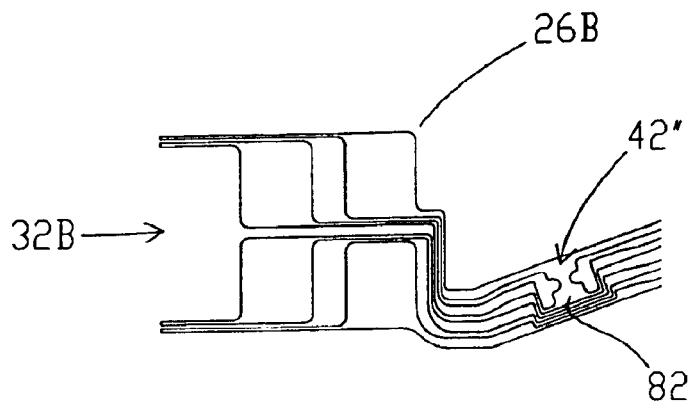
FIG. 14 is a first layer of the embodiment of FIG. 9.
Figure 15:
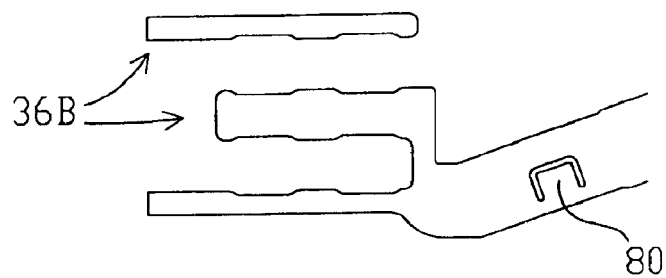
FIG. 15 is a second layer of the embodiment of FIG. 9.
Figure 16:
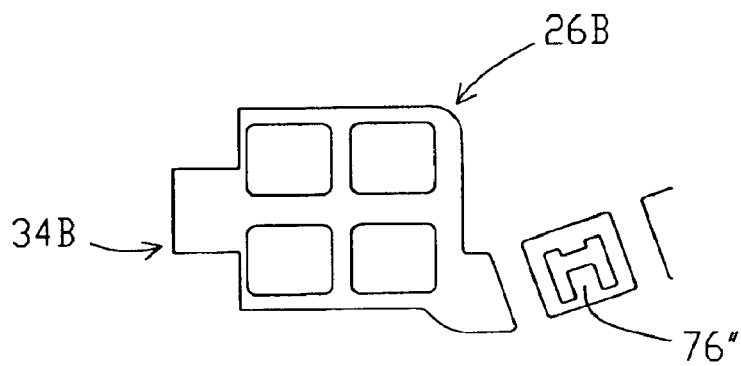
FIG. 16 is a third layer of the embodiment of FIG. 9.
Figure 9:
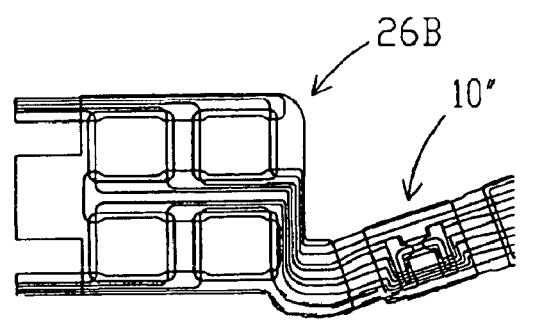
FIG. 9 is another embodiment showing an overlay of the present invention.
Figure 17:
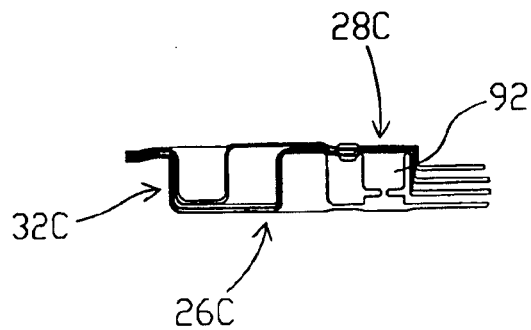
FIG. 17 is a first layer of the embodiment of FIG. 10.
Figure 18:
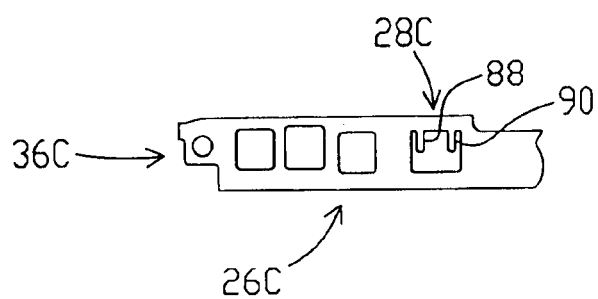
FIG. 18 is a second layer of the embodiment of FIG. 10.
Figure 19:
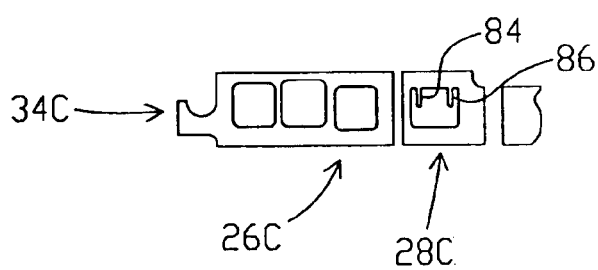
FIG. 19 is a third layer of the embodiment of FIG. 10.
Figure 10:
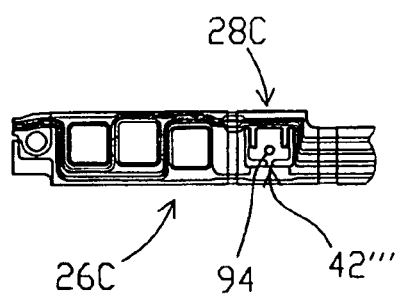
FIG. 10 is still another embodiment showing an overlay of the present invention.

The shunt 10 may take various forms, as indicated in FIGS. 8–10 and 23. The various patterns in each of the layers of the embodiments shown in FIGS. 8–10 are shown in FIGS. 11–19. FIGS. 11, 14 and 17 show the respective conductive layer 32a, 32b, and 32c, (preferably formed of copper) for these embodiments. FIGS. 12, 15 and 18 show the respective dielectric or insulating layer 36a, 36b, 36c, (preferably formed of polyimide, but it is to be understood that other materials may be used for the insulating layer, such as liquid crystal polymers, chlorofluoropolymers, polyesters or polyurethanes) for these embodiments. FIGS. 13, 16 and 19 show respective metal layers 34a, 34b, 34c, (preferably of stainless steel) for these embodiments.

For the embodiment of FIG. 8, there are 3 standard test pads and one switchable shunt test pad. This embodiment is for a single tear away design with four test pads (three standard test pads 26a and one test pad 28a with a shunt) in which all four test pads are preferably removed together after the test pads and shunt are no longer needed. A finger 76 in a portion 34' of the metal layer 34a is provided to act as a spring below the land 38' adjacent the bridge 42.' Dashed circle 78 indicates the location of a test or activation pin.

For the embodiment of FIG. 9, shunt 10" is separate from the test pads 26b. This embodiment is for a stand alone shunt with four standard test pads 26b, and a stand alone shunt 10". In this embodiment, the four test pads 26b may be removed while leaving shunt 10" remaining until the shunt is no longer desired, at which time the shunt 10" is removed independently. For the shunt 10" a finger 76" in the metal layer 34b and a finger 80 in the dielectric layer 36b supports a pad or land 82 in the conductor layer adjacent the bridge 42."

For the embodiment shown in FIG. 10, two fingers 84, 86 in the metal layer 34c, along with corresponding fingers 88, 90 in the dielectric layer 36c support a land 92 in the conductor layer 32c. This embodiment shows a segmented tear away design with four test pads (three standard test pads 26c and one test pad 28c with a shunt). In this embodiment the three standard test pads 26c may be removed after testing, leaving the test pad 28c with shunt remaining. The test pad 28c with shunt is preferably removed at the end of assembly when the shunt is no longer desired. Circle 94 indicates the location or region of contact with an activating pin on land 92, adjacent bridge 42."'

Figure 20:
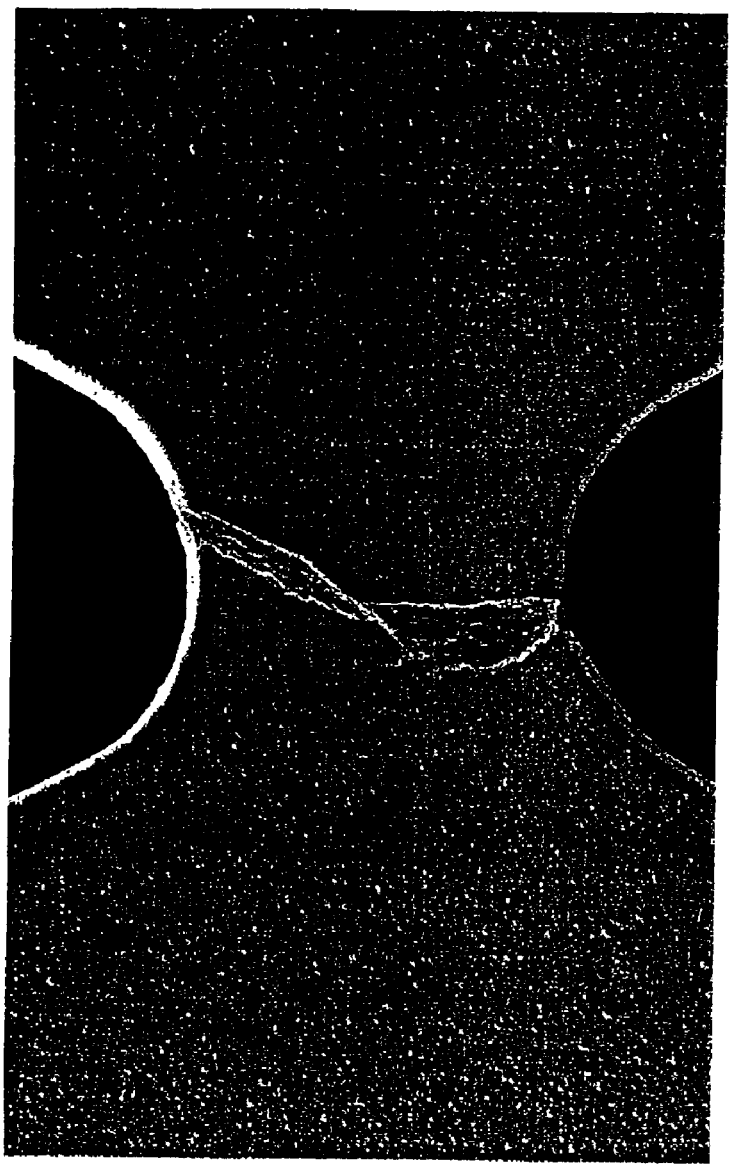
FIG. 20 is a microphotograph of a bridge after rupture shown at a right angle to a first side to illustrate the present invention.
Figure 21:
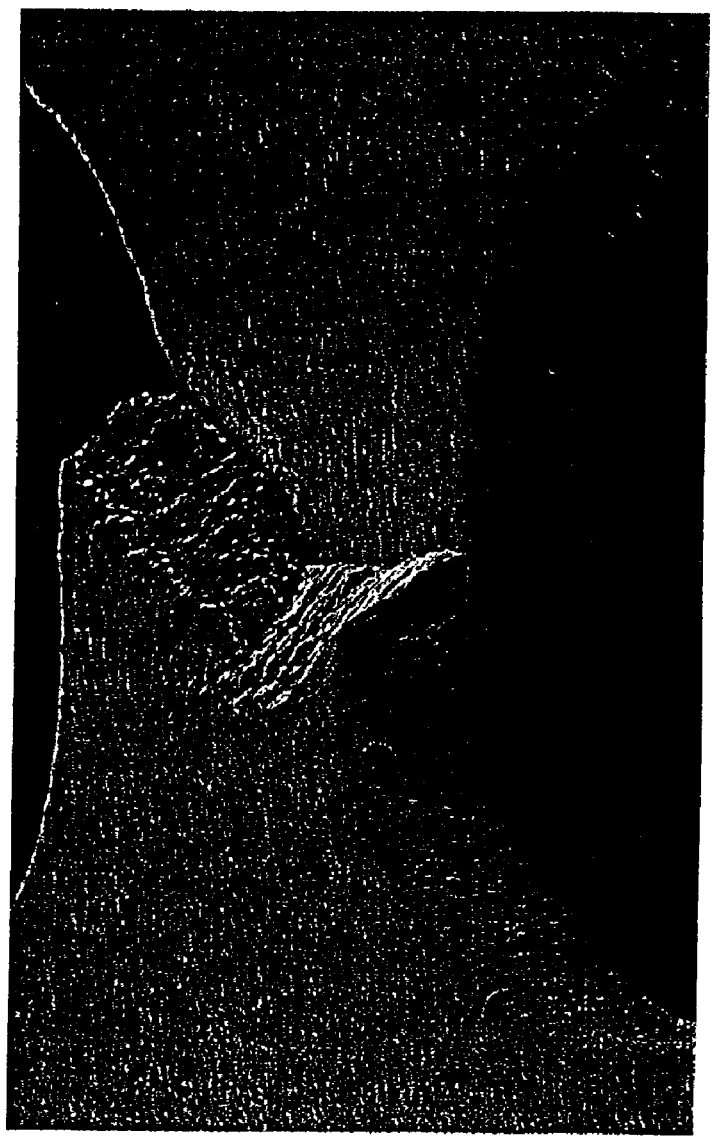
FIG. 21 is a microphotograph of a bridge after rupture shown in a perspective view from a first side to illustrate the present invention.
Figure 22:
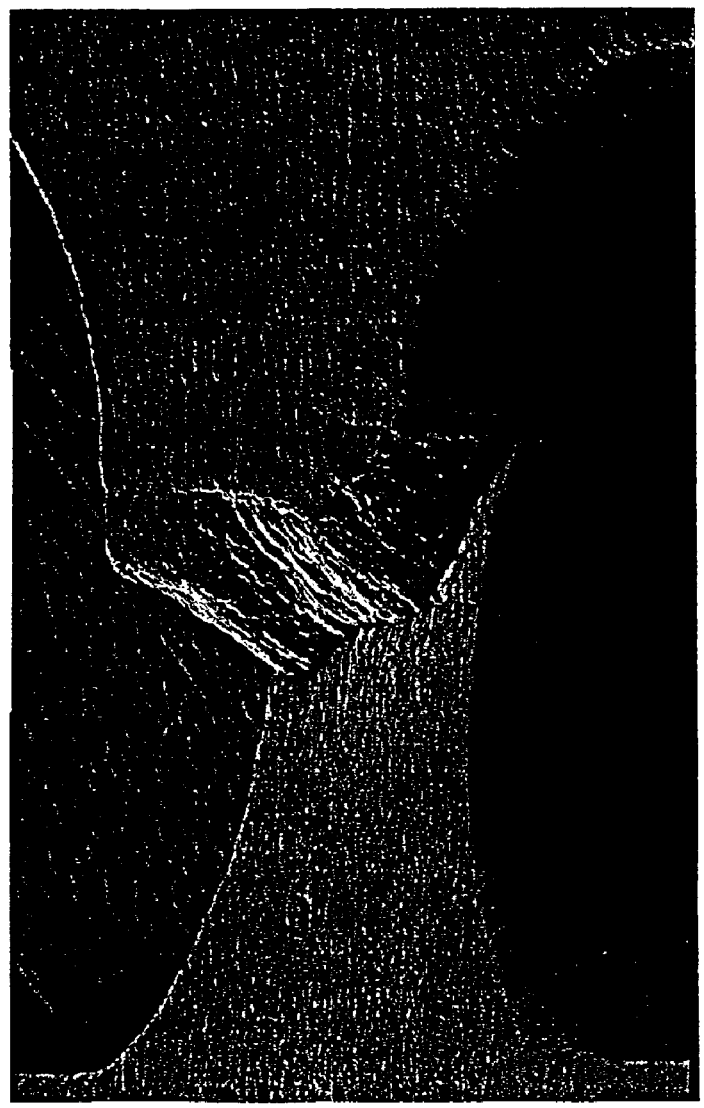
FIG. 22 is a microphotograph of the bridge of FIG. 21 shown in a perspective view from an opposite side to illustrate the present invention.

FIG. 20 shows a microphotograph in plan view of the ruptured ends of a bridge in the practice of the present invention, taken with a scanning electron microscope, viewed from the conductive trace layer side, with a magnification of 350×. The scale of this microphotograph is 1 cm=20 µm. FIG. 21 shows a microphotograph perspective view (taken at an angle of 68 degrees from the vertical) of the ruptured ends of a bridge taken from the conductive trace layer side, with a magnification of 700×. FIG. 22 shows a microphotograph perspective view (taken at an angle of 68 degrees from vertical) of the ruptured ends of a bridge taken from the spring metal layer side of the multilayer material, with a magnification of 700×. Each of FIGS. 20, 21, and 22 show the overlap occurring between the ruptured ends of the bridge after the formation of shunt.

Figure 23:
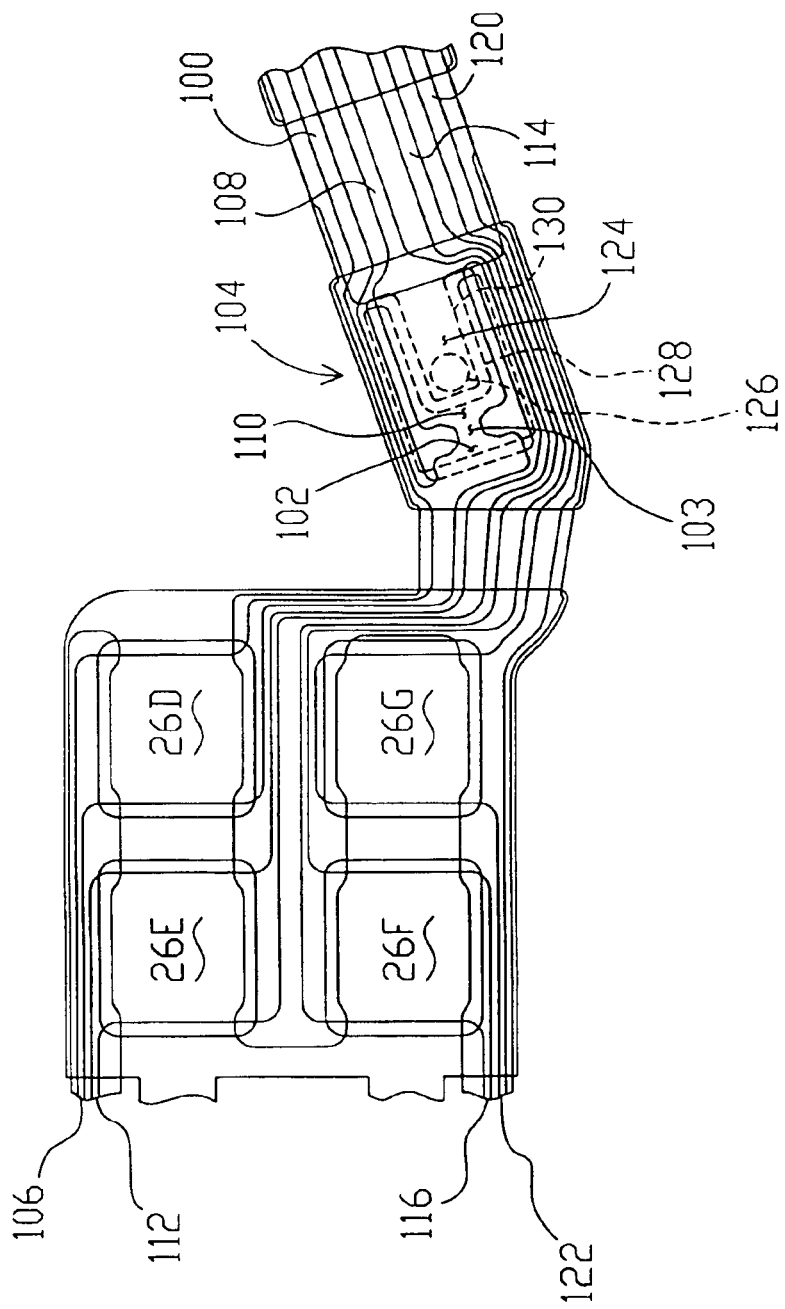
FIG. 23 is an enlarged plan view of a further embodiment of the present invention somewhat similar to that shown in FIG. 9.
Figure 24:
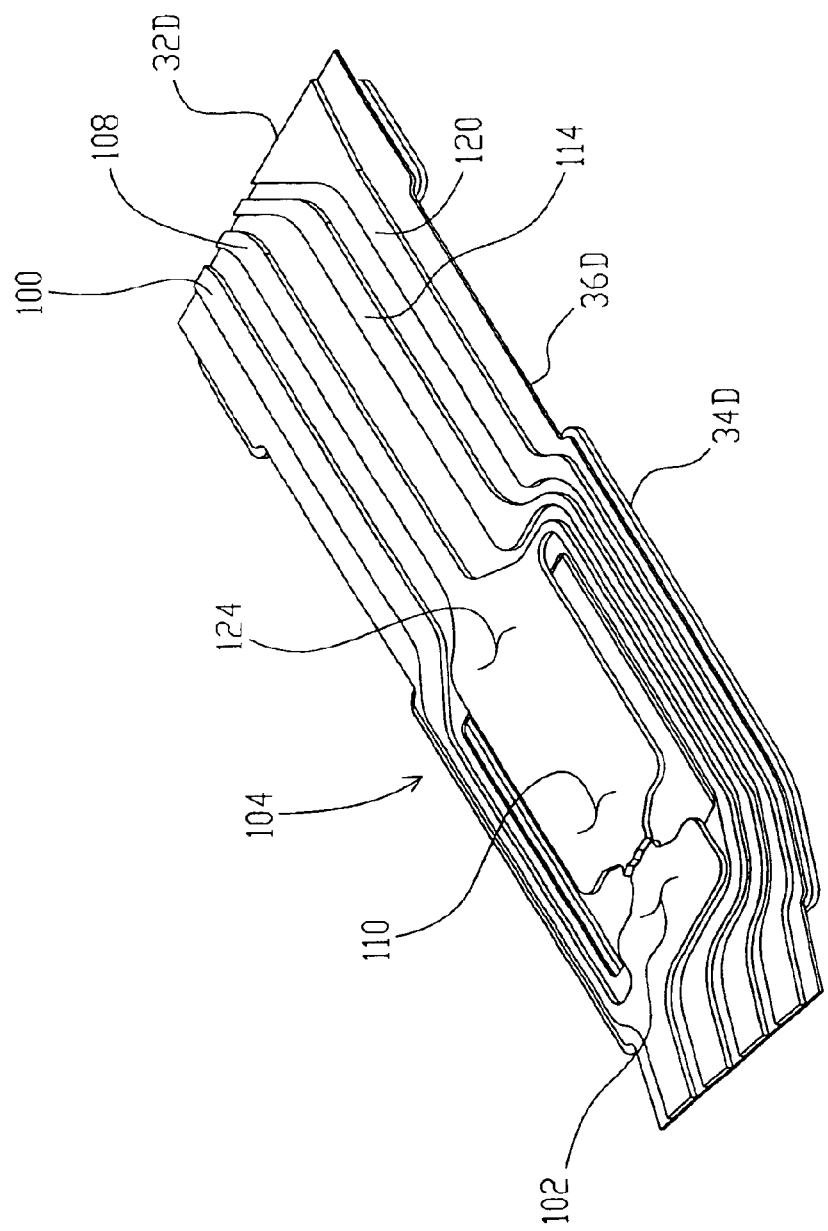
FIG. 24 is a perspective view of a portion of FIG. 23.
Figure 25:
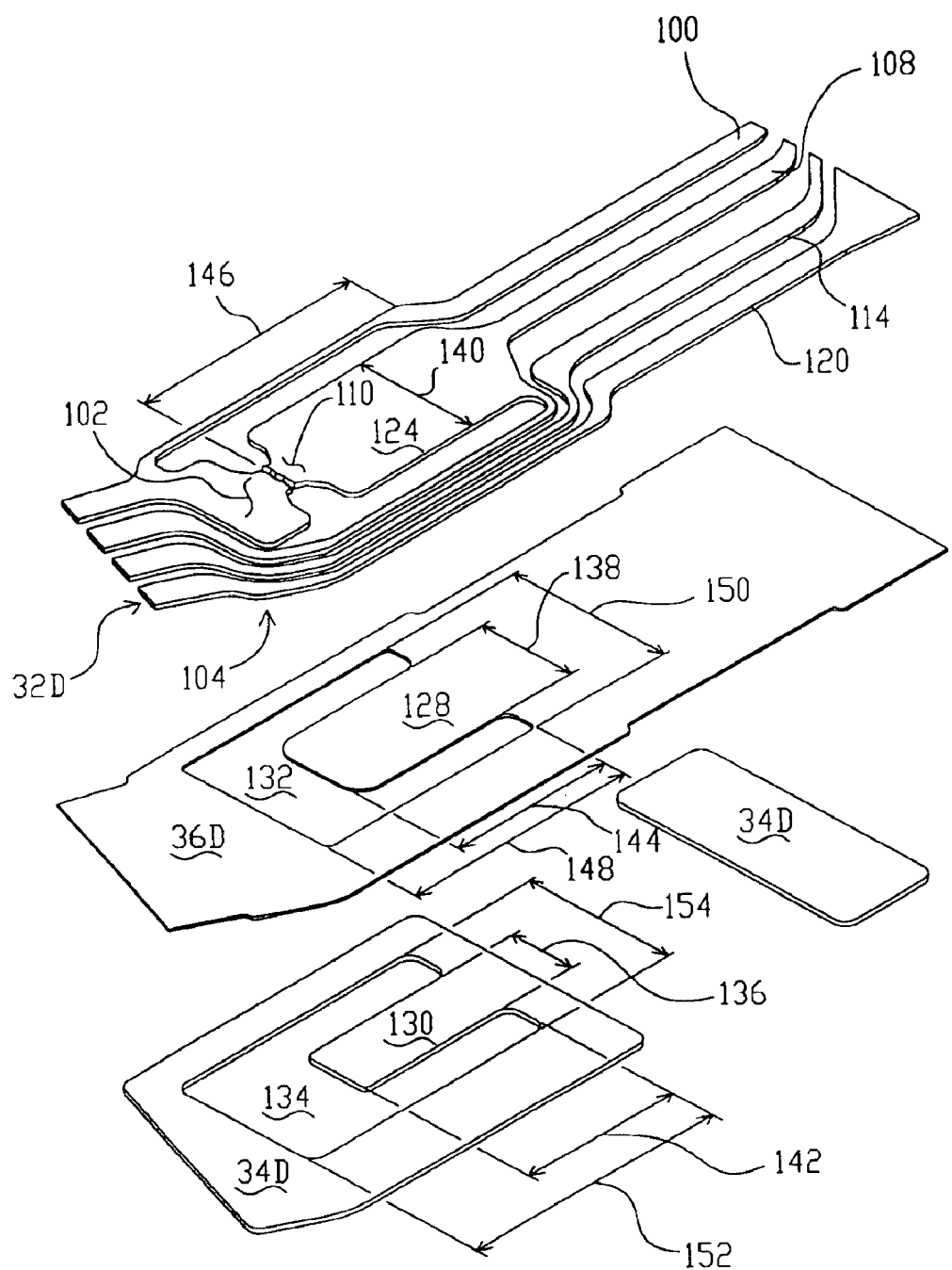
FIG. 25 is an exploded view of the elongated bridge shunt shown in FIG. 24.

FIGS. 23, 24 and 25 show a still further alternative embodiment of the shunt $10^{iv}$ with four standard test pads 26d–g. In this embodiment, a first lead 100 is connected electrically to a first side 102 of a shunt 104 and to a first test pad 26d. Electrical connection is continued from lead 100 beyond test pad 26d at a first lead extension 106. A second lead 108 is connected electrically to a second side 110 of shunt 104 and to a second test pad 26e. Electrical connection is continued from lead 108 beyond test pad 26e at a second lead extension 112. It is to be understood that leads 100 and 108 are further connected to a read/write head (not shown) to be protected by the shunt 104. A third lead 114 is not connected to the shunt, but is electrically connected to test pad 26f and to a third lead extension 116. A fourth lead 120 is not connected to the shunt, but is electrically connected to test pad 26g and to a fourth lead extension 122.

Figure 26:
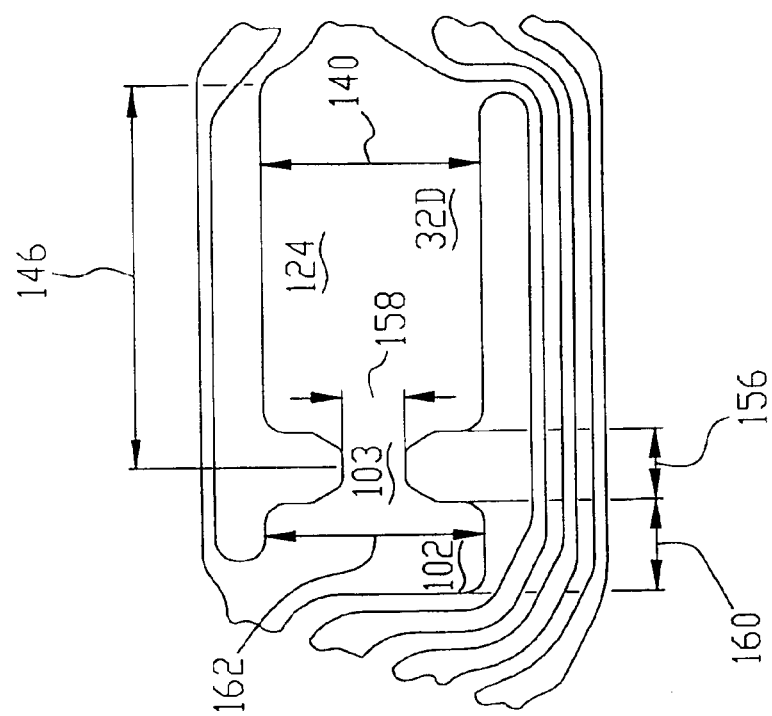
FIG. 26 is a fragmentary plan view of a conductive layer for the elongated bridge shunt shown in FIG. 24.
Figure 27:
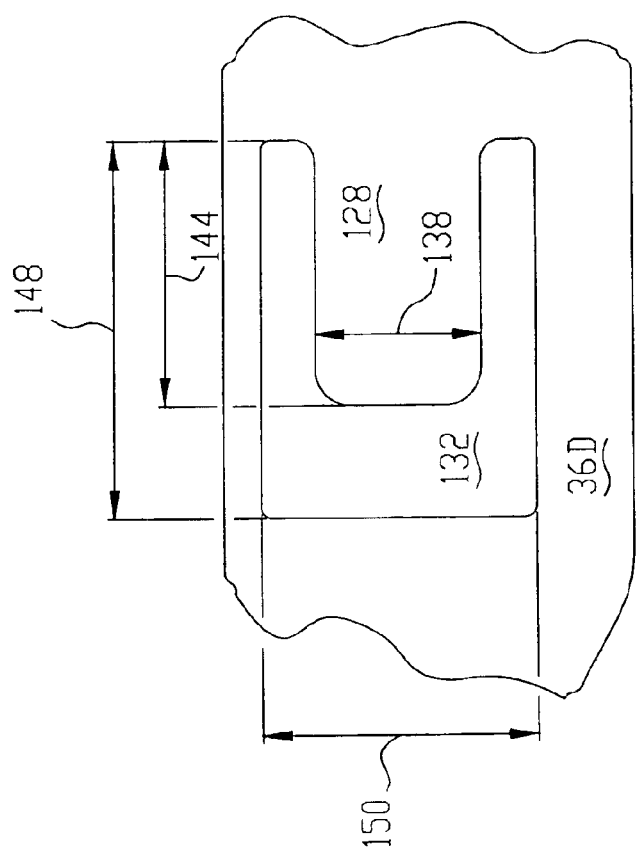
FIG. 27 is a fragmentary plan view of an insulating layer for the elongated bridge shunt shown in FIG. 24.
Figure 28:
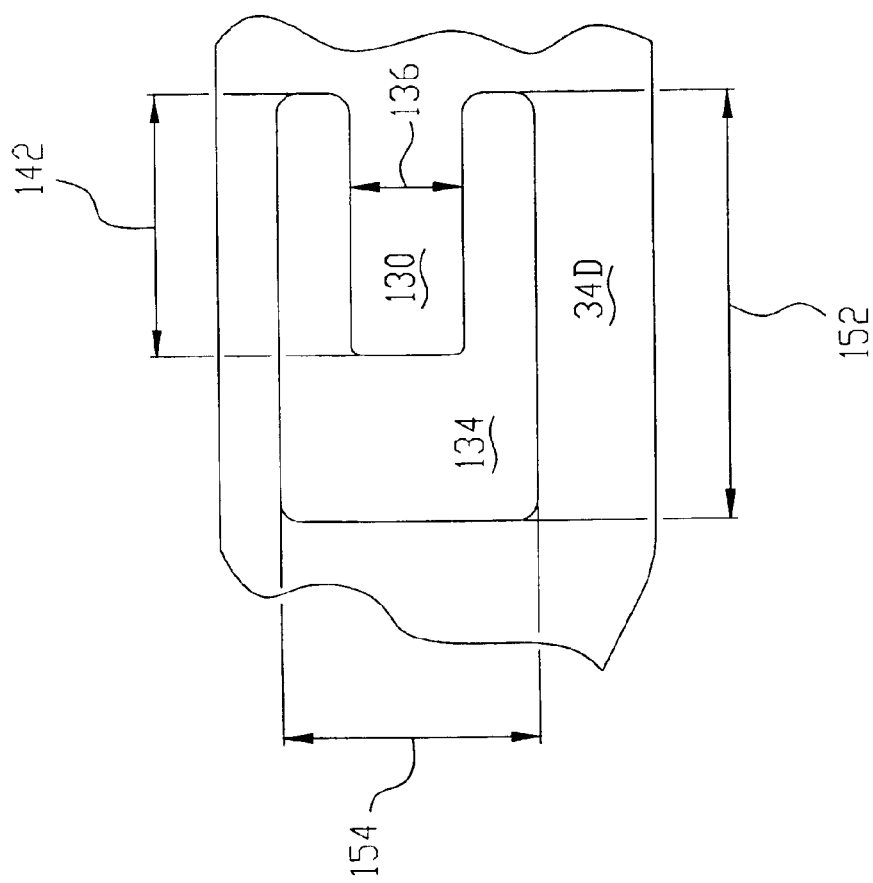
FIG. 28 is a fragmentary plan view of a metal spring layer for the elongated bridge shunt shown in FIG. 24.

Referring now also to FIGS. 26, 27, and 28, fragmentary plan views of the conductive layer 32d, the insulating layer 36d, and the spring metal layer 34d may be seen. In this embodiment, shunt 110 has a single large land 124 and the shunt may be both activated (initially opening) and actuated (repeat opening) by a single pin (not shown), preferably positioned at a location indicated by circle 126 in FIG. 23. The shunt 110 is shown in a pre-activated state in FIGS. 23 and 26, and in a post-activated, closed state in FIGS. 24 and 25. As with other embodiments of this invention, the bridge 103 of shunt 110 is elongated and ruptured in the process of activation, such that the broken bridge ends overlap and make electrical contact with each other after actuation. Moving the pin against land 124 after activation will cause the bridge ends to separate, and removing the contact between the pin and the land allows the bridge ends to reclose, re-establishing electrical connection between leads 100 and 108. It is to be understood that the movement of the pin and land 124 is limited to be within the elastic range of motion of the shunt, to prevent permanently electrically "opening" the shunt. To that end, the area below land 124 is preferably formed in a corresponding cantilevered beam 128 in the dielectric layer 36d, and similarly, the corresponding area in the metal spring layer 34d is also formed as a cantilevered beam 130. Beams 128 and 130 may be seen in FIGS. 23, 25 26, and 28.

For the embodiment shown in FIGS. 23–28, a diameter of preferably about 0.012 inches has been found to be desirable for the actuator pin indicated by circle 126, with a width 136 of preferably about 0.0104 inches for metal spring layer cantilever beam 130, a width 138 of preferably about 0.0155 inches for the insulating layer beam 128, and a width 140 of preferably about 0.0194 inches for the conducting layer land 124. The length 142 of the metal spring layer cantilever beam 130 is preferably about 0.0252 inches, with the length 144 of the cantilever beam 128 of the insulating layer preferably about 0.0258 inches, and the length 146 of the conductive land 124 preferably about 0.0336 inches. The length 148 of recess 132 in the dielectric layer 36d is preferably about 0.0368 inches, and the width 150 is preferably about 0.0258 inches. The length 152 of recess 134 in the metal spring layer 34d is preferably about 0.0414 inches, and the width 154 is preferably about 0.0239 inches. In this embodiment the bridge 103 preferably has a length 156 of about 0.0065 inches and a width 158 of about 0.0055 inches. The smaller land on the first side 102 of the shunt is preferably has a length 160 of about 0.0085 inches and a width 162 of about 0.0194 inches. In the embodiment shown in FIGS. 23–28, the conductive layer 32d is preferably formed of 18 μm (about 0.0007 inches) thick copper, the insulating layer 36d is preferably formed of 10 μm (about 0.0004 inches) thick polyimide, and the metal spring layer 34d is preferably formed of 20 μm (about 0.0008 inches) thick stainless steel. It is to be understood that the dimensions and material choices for the various features of the shunt of the present invention may be varied as desired.

Figure 29:
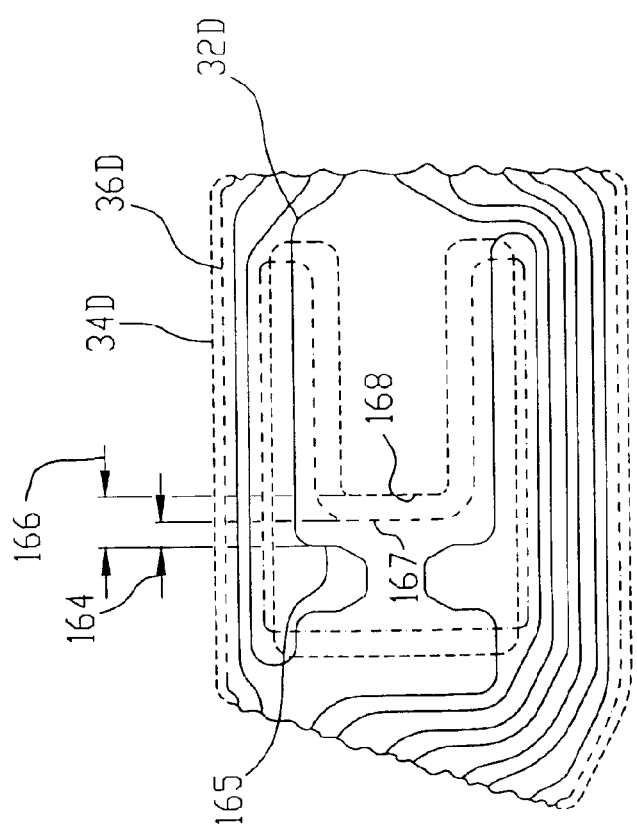
FIG. 29 is an overlay of the fragmentary plan views of FIGS. 26, 27 and 28 to show the alignment of the layers in this embodiment of the invention.

Referring now most particularly to FIG. 29, an overlay of the conductive layer 32d is shown in solid lines, with the insulating layer 36d shown in a chain (dot-dash) line, and the metal spring layer 34d shown in a dashed line. A setback 164 of 0.005 inches from an edge 165 in the conductive layer to a free end 167 of the beam of the insulating layer is preferred, and a setback 166 of 0.0025 inches from the edge 165 to a free end 168 of the metal spring layer beam is preferred. The cantilevered beams in the insulating layer and metal spring layer are preferably centered with respect to the bridge 103 in a direction perpendicular to the direction of the setbacks 164 and 166. It is to be further understood that these dimensions and centered relationships may be varied as desired, while still remaining within the scope of the present invention.

From the above description, it can be seen that the switchable shunt of the present invention includes a pair of planar lands initially connected together by a bridge having a reduced width or thickness. Each land is electrically connected to a separate one of the integrated leads. To make the shunt switchable, the bridge is ruptured by temporarily moving the lands out of plane a sufficient amount to first stretch or plastically deform the bridge to an elongated condition, and then to rupture the bridge, so that when the lands are allowed to return to their original position, the ruptured ends of the bridge overlap and make electrical contact. When it is desired to subsequently open the switchable shunt, at least one of the lands is moved out of plane to physically and electrically open the connection between the ruptured ends of the bridge.

The lands and conductive traces are all preferably formed as unitary or integral features from a copper or copper alloy. The bridge may include the insulator layer, preferably formed of polyimide, and may include features formed of the spring metal layer, which is preferably formed of stainless steel. Generally, whether the bridge or lands include features formed from the polyimide layer 36 and/or the stainless steel layer 34 will depend upon factors such as whether the amount of bias force created by the features in the other layers (e.g., the copper alloy layer 32) is sufficient to enable the shunt 10 to operate in the manner desired. It is to be understood that the present invention may be carried out using only the conductor layer, or using only the conductor and insulator layers, as desired, provided that the layer or layers used are designed to have sufficient spring force to reclose the bridge when released.

When it is desired to perform an electrical test on the integrated lead flexure 8 (e.g., lead sections 20 and 24, terminal pad 18 and/or head terminal 21) or a head (not shown) mounted thereto, a probe can be engaged with the land 40 to move the corresponding ruptured end 66 away from end 64. This can be performed whichever way the ends are overlapped, provided sufficient movement is present to force the shunt 10 into its electrically open state with the ruptured ends 64, 66 disengaged from each other (e.g., as shown in state 60 in FIG. 7). The electrical test system probe (not shown) having pins 52 and 54 can be manipulated to move the shunt to the electrically open state while the electrical test is being performed. When the electrical test is completed, the shunt 10 is returned to its shunted state (shown in state 62 in FIG. 7) by removing the force applied to land 40 by the probe or pin 54. The shunted state is a closed or conducting state in which electrical connection is reestablished across the bridge 42.

The switchable shunts described above offer important advantages. They are effectively and conveniently switchable, allowing tests to be performed on the suspension or heads and the suspension or heads subsequently reshunted. Probes of test instruments can be urged into contact with the lands, and at the same time move the shunt to its open state to permit the test to be performed. In effect, the deshunting step is performed automatically when the test instrument probe is applied. When the instrument probe is withdrawn, the shunt is returned to its shunted state. In the shunted state the shunt has low resistance. The shunt can be formed in a multilayer structure-type suspension or component using conventional manufacturing processes (i.e., etching) without additional (i.e., shunt-specific) steps. The shunts can also be formed by so-called "additive" and other processes. They are compact structures which take up little space on the suspension or component. The shunts or portions thereof can be cut from the suspension (detabbed) following completion of manufacturing and test operations to "permanently" deshunt the suspension, without interfering with the terminal pads on the leads. The shunts of the present invention do not require any added components to the overall assembly, nor do they require any changes or additions to the overall process sequence of manufacture. The shunts of the present invention are tolerant of wide variations in pin location and travel, with reliability controlled more by material properties and photolithography than by forming precision or actuating pin location. The actuation surface can be either copper or stainless steel, (or even the insulating layer, electrical connection is not required). The shunts of the present invention may be actuated from either side of the assembly, or from alternate sides, if desired. Finally, the shunts of the present invention reduce the amount of surface area needed to perform the switchable shunt function, thus reducing size as well as cost. The switchable shunt of the present invention provides continuous electrostatic discharge protection (while the shunt is closed) that is transparent to a user at a dynamic electrical test stand. The present invention will provide increased head gimbal assembly and head suspension assembly yields and eventual improved drive yields with fewer stressed heads. The present invention eliminates other more costly shunting operations resulting in less handling damage, less equipment and floor space for manufacture and test, simplifies process automation in the manufacturing and test process, and provides ease of use and a reliable capability for repeated cycles of opening and closing the shunt circuit. The present invention can be integrated into existing dynamic electrical test pads or formed as a stand alone switch, and can be activated and actuated from either side of the assembly on which it is formed. The present invention is suitable for providing reliable protection during shipping and handling of parts, and will require only replacing spring pins with fixed pins in existing dynamic electrical test tooling, or adding only a fixed pin in a connector clamp for the stand alone switch version. As has been stated, the present invention can be used in flex circuits as well as for head suspension assemblies and components.

Table I is a set of definitions for the switchable shunt of the present invention.

TABLE I

| Name | Description |
|---|---|
| Conductor Bridge, or Copper Bridge | The narrow connection between the large lands that function as the electrical contacts for the switch. |
| Shunt Contacts or Copper Contacts or Conductor Contacts | The two points or regions of switchable conductivity in the shunt; specifically, the two portions of the conductor bridge that when in contact permit electrical current to flow from one land to another land in the conductor layer (conducting state, and when separated prohibit electrical current (non-conducting state). |
| Hinged Tab | A movable portion of the shunt formed by a portion of the land where the actuating pin contacts the shunt and which moves at least one conductor contact from an at-rest condition to actuate the shunt from the conducting state to the non-conducting state. |
| Hinge | An imaginary line forming an axis of rotation of the hinged tab where the hinged tab is constrained by the surrounding mass of one or more of the conductor, dielectric and metal layers. |
| Activate, Activated | The final operation that creates the shunt through the elongation and fracture of the conductor bridge. |
| Operate, Operated or Actuate, Actuated | The shunt is operated or actuated after it has been activated when an actuating pin contacts a hinged tab to move the shunt contacts from the conducting state to the non-conducting state. |
| Open State, Opened | The shunt is said to be in the Open State or Opened when the conductor contacts are separated, thereby creating a high resistance gap that prohibits current flow (non-conducting state). |
| Closed State, Closed | The shunt is said to be in the Closed State or Closed when the actuating pin releases the hinged tab, allowing the conductor contacts to make electrical contact with each other, thereby creating a low resistance current path that permits current flow (conducting state). |

Design Considerations

The following are design considerations for the shunt of the present invention, specifically the metal layer, dielectric layer and conductor layer of the shunt. Preferably the metal layer is stainless steel, the dielectric layer is polyimide, and the conductor layer is copper or copper alloy. The typical thicknesses of the layers are 20 $\mu$m for the metal layer, and 18 $\mu$m for each of the dielectric and conductor layers. Alternatively, other thicknesses may be used as desired.

Fundamental Requirement

When the shunt is opened by deflecting one or more of the hinged tabs out of plane, both elastic and plastic stress and strain occur. Reliability of the shunt requires that the elastic forces that act to close the shunt be sufficiently large to counteract the plastic strain and deformation that is expected to accumulate during repeated operation of the shunt.

Source of Spring Action: Stainless Steel vs Copper vs Polyimide

Because the hierarchy of the elastic modulus of the three layers from highest to lowest is stainless steel, copper and polyimide, that is also the likely hierarchy for the preferred layer to be used to create the features that ensure the elastic forces close the shunt. The elastic modulus of the stainless and copper are relatively similar, both on the order of $10^9$ mN/mm$^2$, while the modulus of the polyimide layer is significantly lower at $10^6$ mN/mm$^2$. Although three orders of magnitude lower than stainless steel and copper, the low modulus of elasticity of the polyimide does not necessarily preclude it from contributing sufficient elastic force to close the shunt itself (i.e. without the aid of the stainless steel or copper layers). By way of analogy to the design of coil springs, the size of the spring or the amount of material that undergoes strain, has as much to do the spring force as the intrinsic properties of the material from which the spring is formed. In other words, a large amount of polyimide (for example, polyimide surrounding a large portion of the hinged tab perimeter) may be designed to provide the same elastic force as a much smaller amount of stainless steel or copper (for example, small fingers extending from the hinge).

Switchable Shunt Design Principles

1. Locate the stainless fingers, if the fingers are necessary at all, in the region of the hinged tab that undergoes the greatest amount of deflection. The region of the hinged tab that undergoes the greatest amount of deflection will tend to be the region where the actuation pin contacts and that is least constrained by attachment to the polyimide and stainless steel layers.
2. Minimize the size of stainless fingers that extend into the test pad/actuating pin contact area, such that they do not interfere with the actuating pins, thereby preventing contact of the actuating pins with the copper layer (for designs where the actuating pins also function as the electrical test pins). Size here refers to both the length (from the hinge) as well as the width of the fingers.
3. Maximize the size of the stainless fingers such that the elastic spring forces to close the shunt are sufficient to reliably close the shunt. The size here refers to both the length (from the hinge) as well as the width of the fingers.
4. The opening in the stainless steel and polyimide layers must be designed such that unwanted stresses are not placed on the narrow copper conductors that extend from the large copper lands, otherwise, the narrow copper conductors would fracture just as the similarly sized copper bridge. The stainless steel and polyimide are preferably patterned to have the corners of the copper lands that have narrow conductors extending away from them constrained by the presence of polyimide and, if necessary, stainless steel backing layers at these corners.
5. If the hinge of the hinged tab is located along a diagonal line through the rectangular or square land, any plastic deformation that occurs may tend to create twisting of one or both of the contacts such that they are no longer in the same plane when the shunt is in the closed state. Placement of a stainless finger on the least constrained side of the large copper land will counteract such a twisting deformation and tend to bring the contact back to the original plane when the shunt is closed.
6. The relief or openings in the polyimide layer are preferably patterned in one of two distinct patterns. If the shunt is designed with the polyimide acting as the sole spring member that returns the contacts to the closed state, then the polyimide opening will be minimized, going as far as removing the polyimide only in the immediate vicinity of the copper bridge, or even leaving the polyimide completely intact in the region of the shunt. If the shunt is designed with the copper or stainless steel acting to return the contacts to the closed state, then the polyimide openings may be enlarged to permit free movement of the hinged tab and to avoid tearing of the polyimide at stress concentration points.

All three layers, especially the polyimide and copper, are preferably patterned to minimize stress concentration points that may lead to tearing or cracking of the polyimide or copper. This is accomplished by maximizing the radius size of the copper and polyimide contours near the hinge and taking care that the thin copper conductors are well constrained and supported by the presence of surrounding (subjacent) polyimide and stainless steel.

The conductive layer is preferably plated at least in the region of the shunt with a non-oxidizing material where exposed to air. The conductive layer on suspension assemblies is typically plated with gold or nickel then gold. The typical thickness range for gold is 1 µm to 4 µm, and for nickel is 0.3 µm to 3 µm. Without the plating, copper is susceptible to oxidation. Since the oxide coating reduces conductivity and is not well adhered, it is desirable to use plating in the practice of the present invention. While not absolutely essential, gold-to-gold contact (when present at the switching surfaces) improves the performance of the present invention.

An alternative to the stretching and breaking formation of the shunt of the present invention described above is to either form the bridge with a gap initially or sever (preferably by shearing) the bridge to form two ends that can be used to form the switching elements of the shunt. In either the version with the gapped or severed ends, at least one of the ends is compressed or coined to cause it to elongate and overlap the other end, to create a reliable switching mechanism. Such elongation by compression is preferably performed when the ends of the bridge are out of plane with each other, to permit unrestricted elongation. Release of the elongated end allows the two ends of the bridge to return to an electrically conductive state because of the memory of the elongated end attempting to return itself to the original plane of the bridge. Coining has advantages over the tensile deformation and rupture (described above) such as the ability of plating all surfaces of the ends of the bridge (with the etched gap version) and to form a more controlled edge to the ends of the bridge (with both the sheared and etched gap versions). The tensile deformation and rupture version may expose copper at the rupture site. The unplated copper may oxidize, and result in contamination of the disk drive in the event oxidized material separates from the shunt. Coining the bridge end also yields a more consistent and controlled edge. The tensile deformation and rupture method results in a rough or ragged edge with consequent uncertain support of the various plating layer(s) (gold, nickel or palladium) by the copper.

One embodiment of the present invention is to pattern a split bridge, or a bridge having an etched gap between ends of the bridge, with a minimal gap, using standard photolithography and etching methods, followed by coining or compressing one or both ends (or a region or region affecting, i.e., slightly spaced from, one or both ends) to elongate one or both ends to cause overlap of the ends of the bridge. This allows for all surfaces of the copper layer to be plated with a surface finish metal such as gold, nickel or palladium.

Another embodiment is to pattern an intact or initially connected bridge, then shear or otherwise sever the bridge to form two electrically and mechanically isolated ends, and then coin or compress at least one end of the bridge to provide overlap of the ends with respect to each other. This embodiment typically will have an exposed copper surface, similar to the tensile deformation and rupture embodiment, but may have more geometrically regular surfaces at the ends of the bridge because of the severing instead of "tearing" action in separating the bridge ends.

Figure 30:
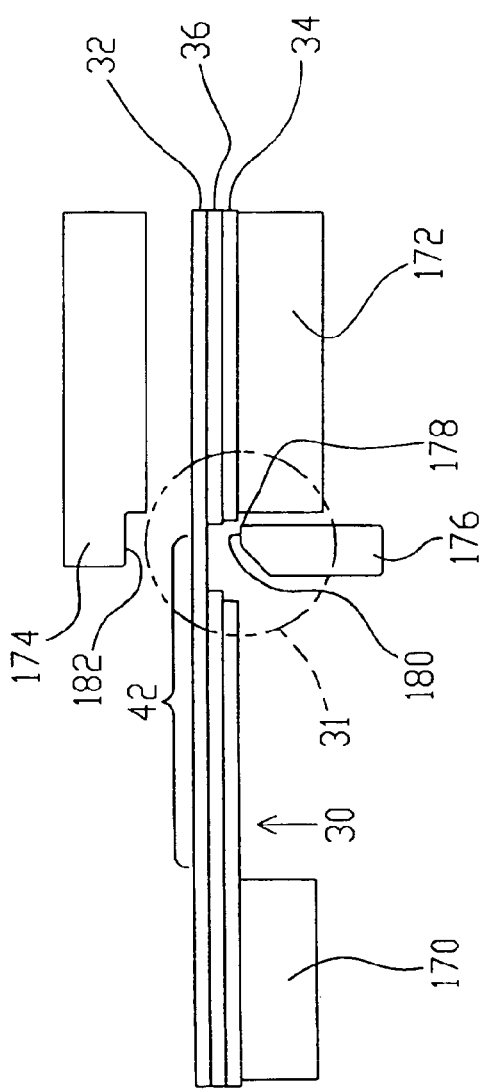
FIG. 30 is a side elevation view of an alternative embodiment of the present invention wherein the bridge is initially connected and ready to be severed and elongated.
Figure 31:
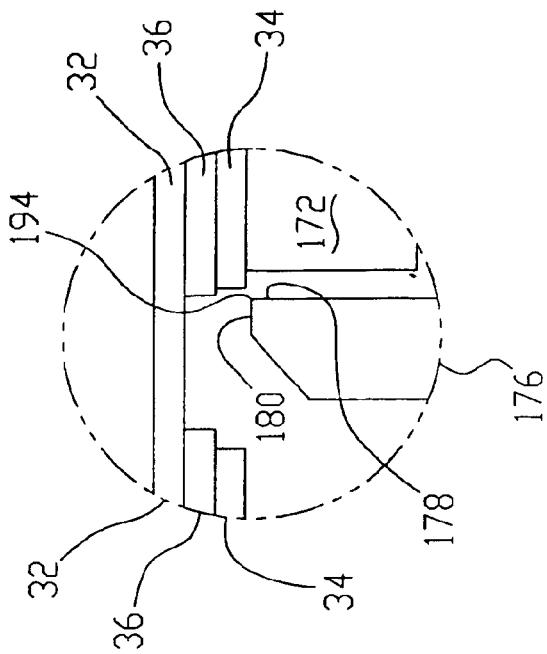
FIG. 31 shows an enlarged view of region 31 of FIG. 30.

Referring now to FIGS. 30 through 37, the alternative embodiment of the method and shunt of the present invention using the initially connected and subsequently severed bridge may be seen. In this embodiment, the bridge 42 is initially formed with a continuous conductor in the conductive layer 32. The laminated or multilayer sheet of material 30 is positioned by first and second tooling supports 170, 172. FIGS. 30 and 31 show the bridge in a first position, ready to be clamped by a clamp 174 which also serves as an anvil, as will be described infra. A mandrel or forming punch 176 is shown in these figures in a "ready" position. It is to be understood that mandrel 176 is preferably rectangular in cross section and may have a corner or edge 194 on a surface 178 for severing at least the conductive layer 32. Forming punch also has a face 180 opposing surface 182 on clamp 174, it being understood that surface 182 is the anvil.

Figure 32:
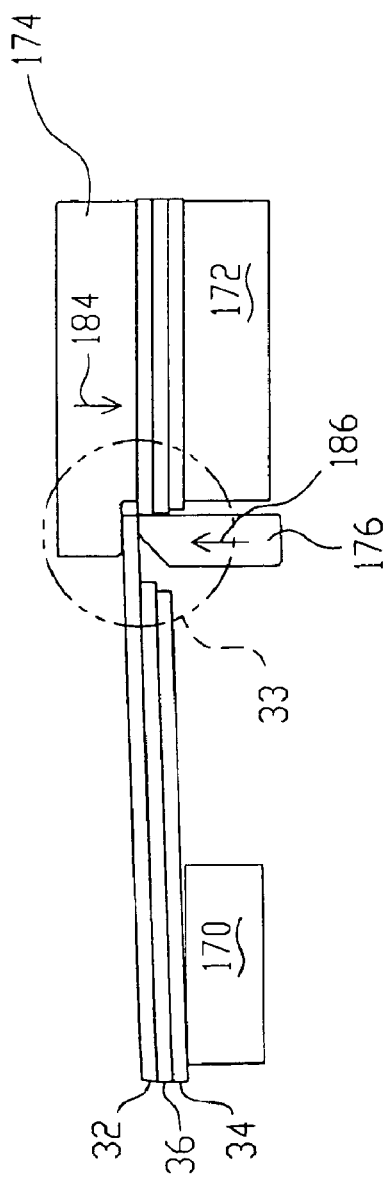
FIG. 32 is a side elevation view of the embodiment shown in FIG. 30, except with parts advanced to show the bridge being severed.
Figure 33:
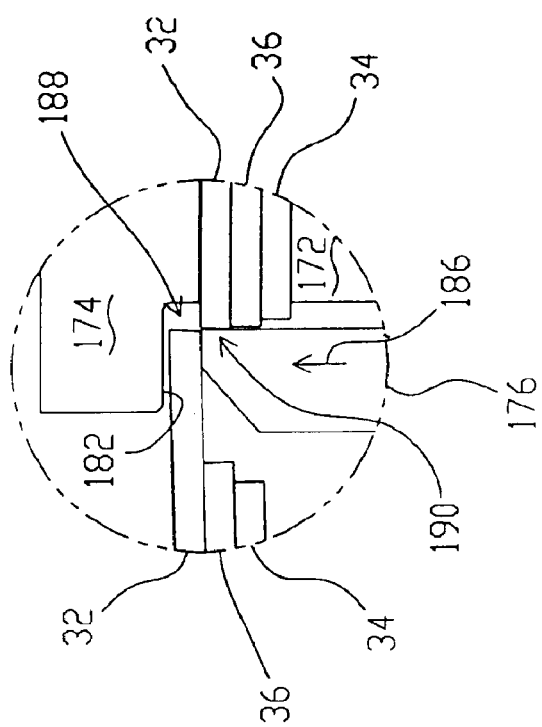
FIG. 33 shows an enlarged view of region 33 of FIG. 32.

Referring now most particularly to FIGS. 32 and 33, it is to be understood that clamp 174 is first moved in the direction of arrow 184 to the position shown in these figures, and then forming punch 176 moves in the direction of arrow 186 to the position shown in these figures, to sever the bridge (using edge 194 and surface 178) into first and second disconnected ends 188, 190. The action of mandrel 176 may be a shearing action in which the severing progresses transversely across at least conductive layer 32 (i.e., moving either into or out of the plane of the paper) or the severing action may be a chopping action in which the leading corner 194 of surface 178 contacts the conductive layer generally uniformly transversely across the bridge 42. Other form of severing bridge 42 are within the scope of this embodiment, so long as the bridge 42 is severed into first and second disconnected ends 188, 190.

Figure 34:
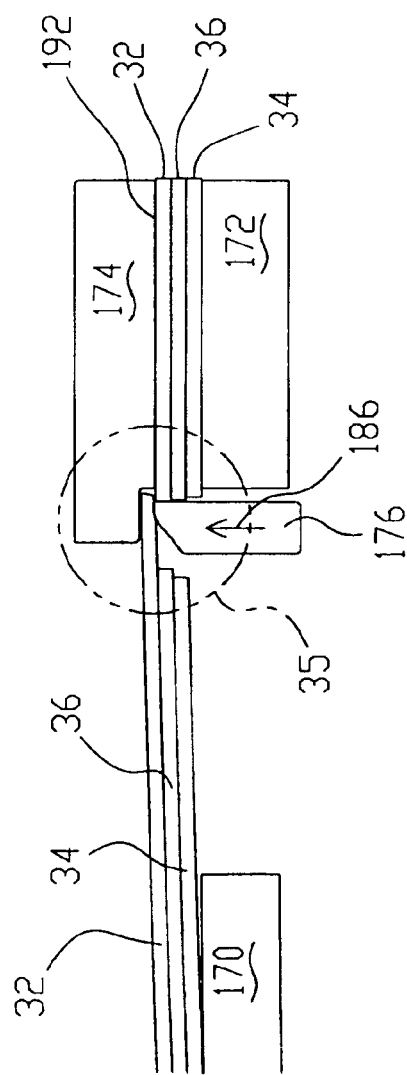
FIG. 34 is a side elevation view of the embodiment shown in FIG. 30, except with parts advanced to show an end of the bridge being elongated by compression in a coining operation.
Figure 35:
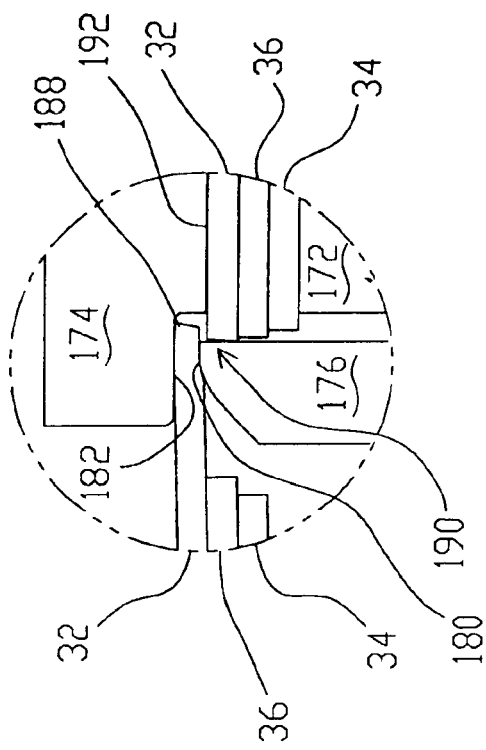
FIG. 35 shows an enlarged view of region 35 of FIG. 34.

Referring now to FIGS. 34 and 35, punch 176 advances further in the direction of arrow 186, until face 180 contacts and compresses or "coins" the first end 188 against anvil 182, causing first end 188 to elongate and overlap second end 190. It may be seen that during this step, the first end is moved out of plane with the second end 190 (where the plane referred to is defined by the top surface 192 of the conductive layer 32 in the region near second end 190 where it is held by clamp 174). At this point, the shunt has been "activated" and is ready for operation as a switch.

Figure 36:
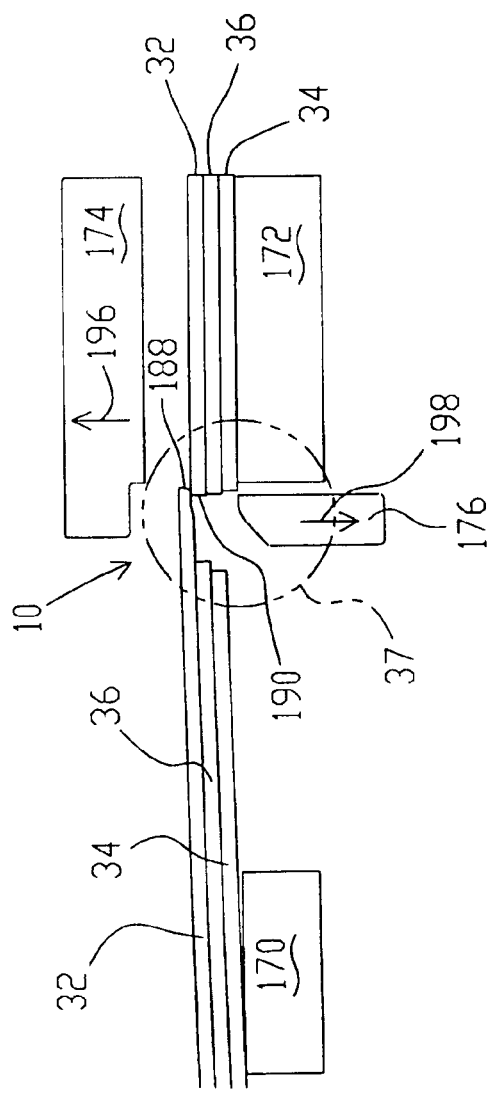
FIG. 36 is a side elevation view of the embodiment shown in FIG. 30, except with parts retracted to show the ends of the bridge forming the shunt in a closed-circuit position.
Figure 37:
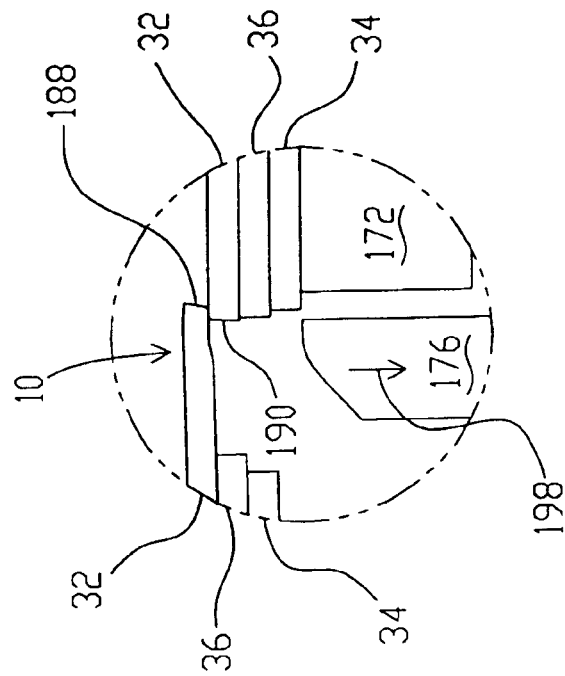
FIG. 37 shows an enlarged view of region 37 of FIG. 36.

Referring now to FIGS. 36 and 37, clamp 174 retracts in the direction of arrow 196, and punch 176 retracts in the direction of arrow 198. The shunt 10 is now in a closed position, restoring electrical connection between first and second ends 188, 190, because of the spring action of one or more layers of laminate or multilayer 30 adjacent the first end 188 attempting to return end 188 to the plane 192 in which it originally resided before formation of the shunt 10. As may be seen in these figures, shunt 10 has first and second overlapped ends 188, 190 forming a switch in a normally-closed electrical condition, and able to be operated or actuated by pressing end 188 in the direction of arrow 186, when it is desired to open the switch. The assembly containing shunt 10 may now be removed from first and second tooling support and advanced for further manufacturing processing.

Figure 38:
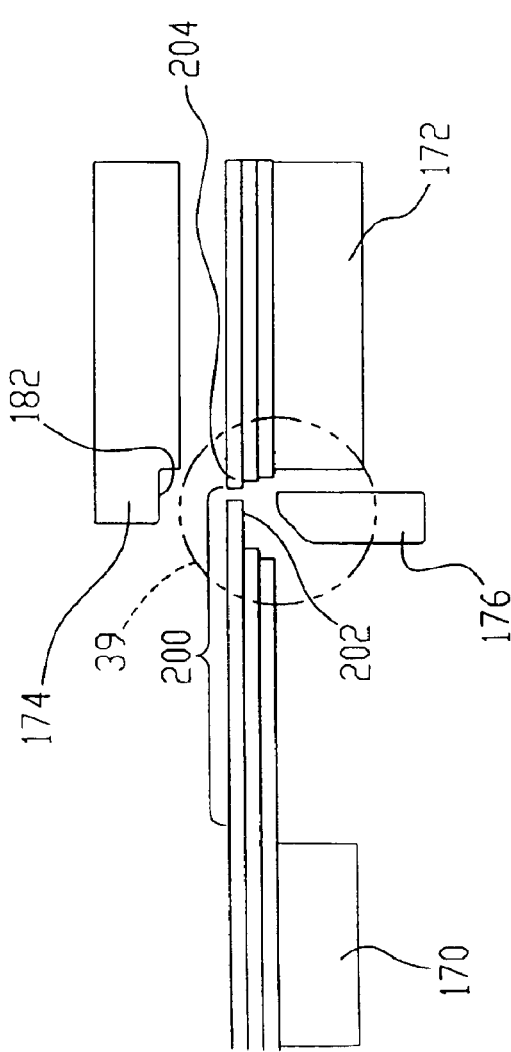
FIG. 38 is a side elevation view of another alternative embodiment of the present invention wherein the bridge is initially formed with a gap between ends of the bridge.
Figure 39:
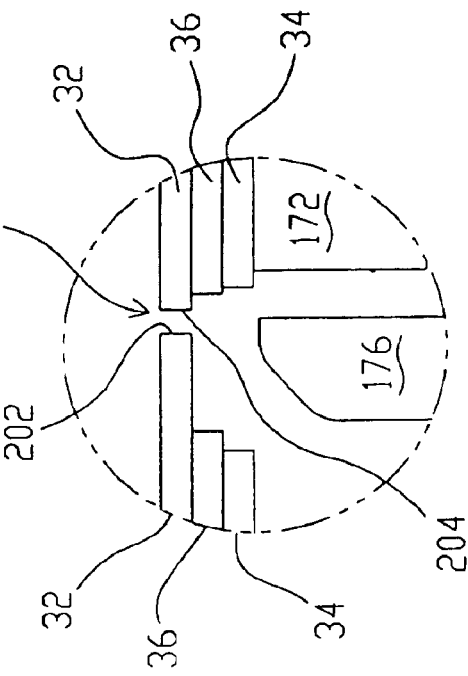
FIG. 39 shows an enlarged view of region 39 of FIG. 38.

Another embodiment of the method and shunt of the present invention using a bridge 200 having initially disconnected first and second ends 202, 204 may be seen in FIGS. 38–45. In this embodiment, the bridge 200 is initially formed with a gap 206 (preferably formed by etching) in the conductive layer 32. The laminated or multilayer sheet of material 30 is positioned by first and second tooling supports 170, 172. FIGS. 38 and 39 show the bridge 200 in a first position, ready to be clamped by the clamp 174 which, again, also serves as an anvil 182. The mandrel or forming punch 176 is in a "ready" position. Forming punch 176 need only have coining face 180 for this embodiment, since no severing is required. Face 180 opposes and is arranged to advance toward anvil 182 on clamp 174.

Figure 41:
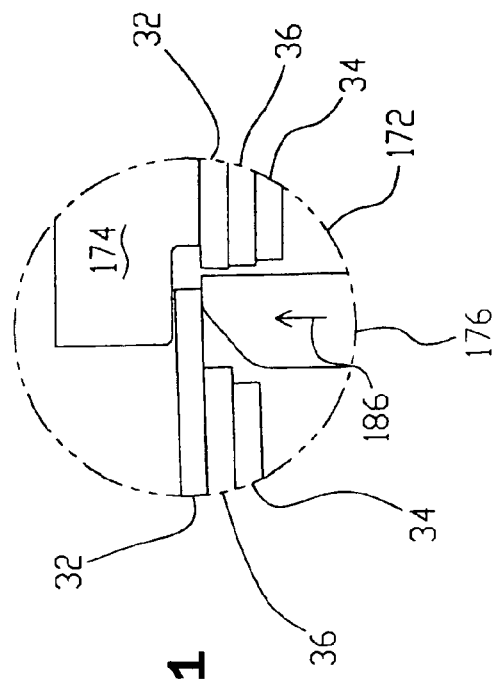
FIG. 41 shows an enlarged view of region 41 of FIG. 40.
Figure 40:
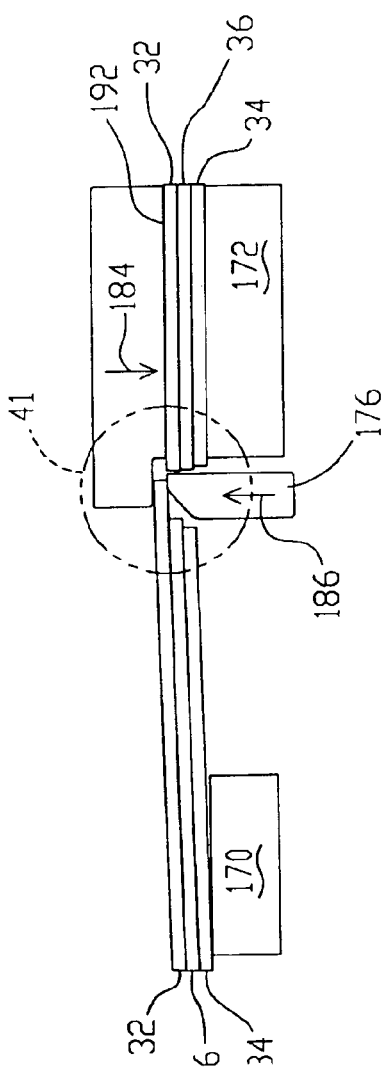
FIG. 40 is a side elevation view of the embodiment shown in FIG. 38, except with parts advanced to show one end of the bridge being move out of plane with respect to the other end of the bridge.

Referring now most particularly to FIGS. 40 and 41, clamp 174 is first moved in the direction of arrow 184 to the position shown in these figures, and then forming punch 176 moves in the direction of arrow 186 to the position shown in these figures, to contact first disconnected end 202 to move end 202 out of plane 192 and into contact with anvil 182.

Figure 42:
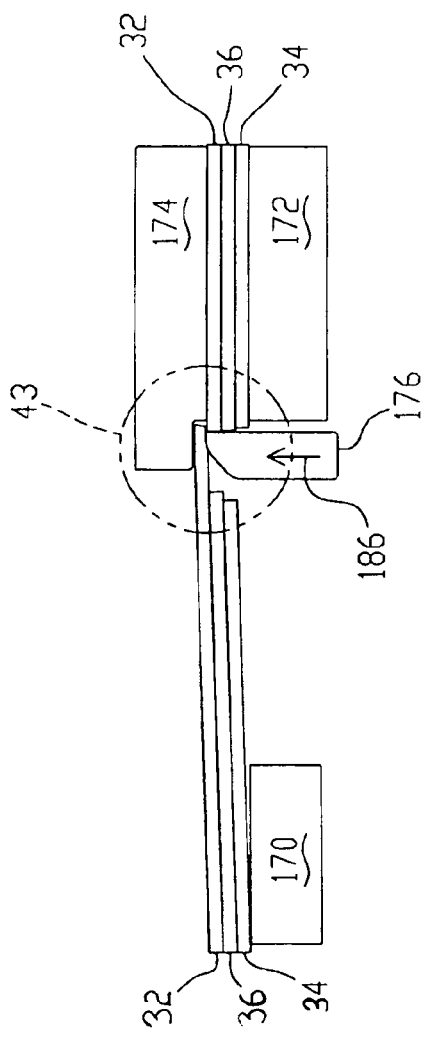
FIG. 42 is a side elevation view of the embodiment shown in FIG. 38, except with parts advanced to show the end of the bridge that was moved out of plane being elongated by compression in a coining operation.
Figure 43:
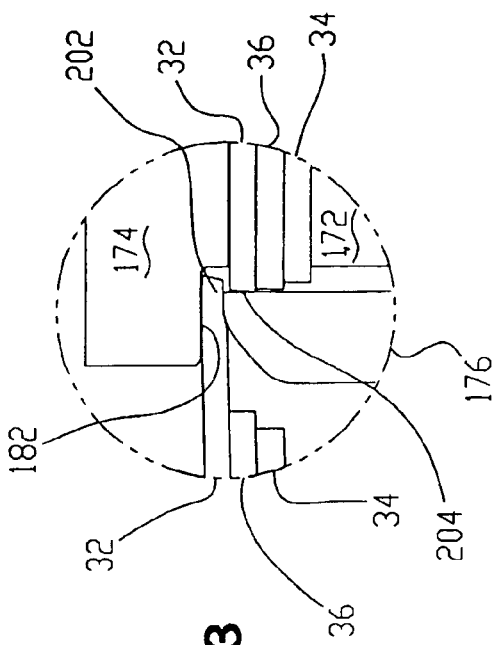
FIG. 43 shows an enlarged view of region 43 of FIG. 42.

Referring now to FIGS. 42 and 43, punch 176 advances further in the direction of arrow 186, with face 180 compressing or "coining" the first end 202 against anvil 182, causing first end 202 to elongate and overlap second end 204. It may be seen that during this step, the first end 202 remains out of plane with the second end 204 (where the plane referred to is again defined by the top surface 192 of the conductive layer 32 in the region near second end 204 where it is held by clamp 174). At this point, the shunt has been "activated" and is ready for operation as a switch. With this embodiment, the entire surfaces of ends 202 and 204 may be plated after etching to form the gap 206, to avoid or minimize oxidation on the shunt switching surfaces.

Figure 44:
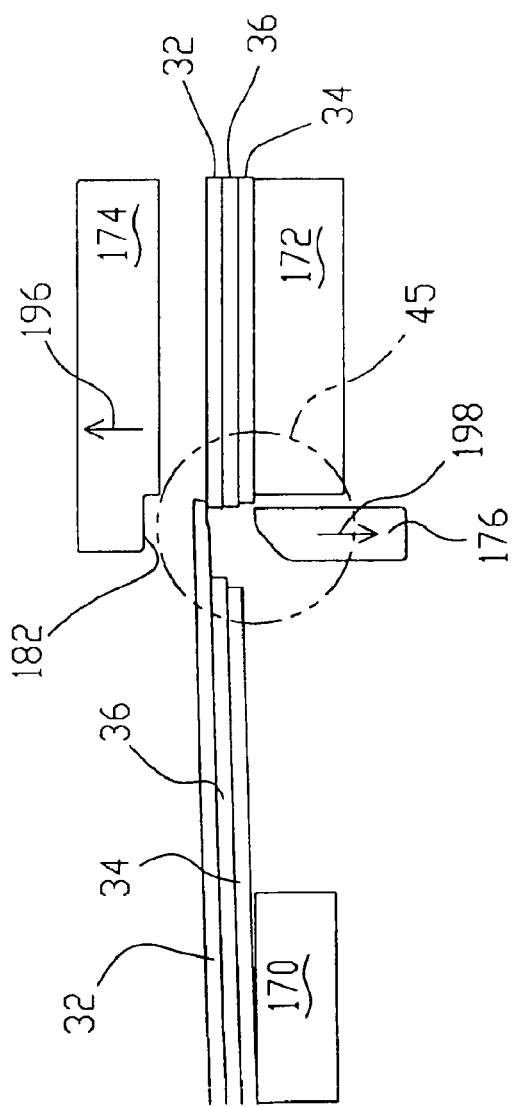
FIG. 44 is a side elevation view of the embodiment shown in FIG. 38, except with parts retracted to show the ends of the bridge forming the shunt in a closed-circuit position.
Figure 45:
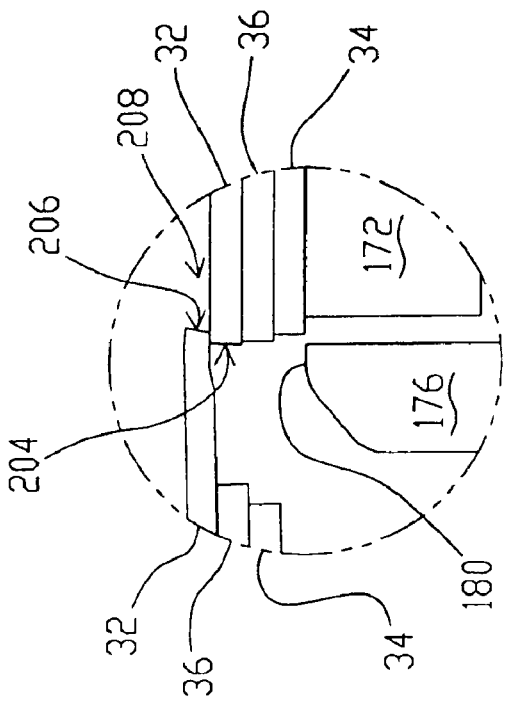
FIG. 45 shows an enlarged view of region 45 of FIG. 44.

Referring now to FIGS. 44 and 45, clamp 174 retracts in the direction of arrow 196, and punch 176 retracts in the direction of arrow 198. The shunt 10 is now in a closed position, restoring electrical connection between first and second ends 202 and 204, because of the spring action of one or more layers of laminate or multilayer 30 adjacent the first end 202 attempting to return end 202 to the plane 192 in which it originally resided before formation of the shunt 10. As may be seen in these figures, shunt 10 has first and second overlapped ends 202, 204 forming a switch in a normally-closed electrical condition, and able to be operated or actuated by pressing end 202 in the direction of arrow 186, when it is desired to open the switch. The assembly containing shunt 10 of this embodiment may now be removed from first and second tooling support and advanced for further manufacturing processing. It is to be understood that the form of this embodiment may be used to elongate both ends of the bridge, whether the bridge is severed or initially formed with an etched gap. Elongating both ends of the bridge has the advantage of reducing the amount of elongation of each end, at the disadvantage of additional tooling and/or processing to compress both ends.

The present invention is thus seen (in one embodiment) to be an electrically switchable shunt having a relatively narrow bridge of conductive material between two lands in the conductive layer which is initially stretched and eventually ruptured when at least a portion of at least one land adjacent the bridge is moved out of plane by an activating pin. The ruptured ends of the bridge are electrically reconnected by a spring action of one or more of the conductive, dielectric and metal layers of the shunt. This action of the ruptured ends of the bridge is equally useful in flex circuit applications, in addition to those applications for head suspension assemblies. The shunt may be formed integrally with or separate from the test pads. Fingers in the metal layer and dielectric layer optionally extend under at least one conductive land adjacent the bridge, for increasing the spring rate and spring force to reclose the electrical connection formed by the elongated, ruptured ends of the bridge. Once formed to an operable state (or "activated") the shunt of this invention may be repeatedly electrically opened and closed (or "actuated") during testing of the assembly to which the shunt is attached, after which the shunt may be removed by severing it from the remaining circuitry.

When the shunt is integrated with test pads, several advantages are achieved, most notably in manufacturing cost, design flexibility, and ease of use. When the shunt is integrated with the test pads, there is little or no impact on the width and length of the test pads, and the manufacturing cost to add the shunt is minimized. The flexure version of a component with which the present invention is to be used is typically manufactured in panels which contain hundreds of individual flexures. Since the number of small flexures that fit into a standardized panel size is greater than the number of large flexures, the cost per flexure to manufacture smaller flexures is lower than for larger flexures. For this reason, it is believed that integrating the shunt of the present invention into the test pads will result in lower manufacturing cost than a "stand-alone" shunt design. Integrating the shunt of the present invention into the test pads also permits greater design flexibility, since a designer does not need to be concerned with where to place the shunt to minimize cost. Finally, integrating the shunt of the present invention with the test pads makes it easier for a customer to use, or actuate, the shunt, since the fixturing required to actuate or operate the shunt is less than that required for a stand-alone shunt which requires the addition of a new pin to actuate the stand alone shunt. In contrast, the present invention allows the pin existing to contact the test pad to also actuate the shunt.

This invention is not to be taken as limited to all of the details thereof as modifications and variations thereof may be made without departing from the spirit or scope of the invention. For example, each of the embodiments included herein may be used to form a shunt in a flex circuit, if desired.

What is claimed is:

1. A switchable shunt for a head suspension of the type having a multilayer construction for leads connected to a magnetic head, the multilayer construction including a conductive layer, an insulating layer and a metal spring layer, the shunt comprising a pair of separable electrical leads in the conductive layer electrically connected together by overlapping ends of a bridge, with each end of the bridge electrically connected to a separate one of the pair of leads in the conductive layer.

2. The switchable shunt of claim 1 wherein the bridge includes a reduced cross sectional area.

3. The switchable shunt of claim 2 wherein the reduced cross sectional area is formed by a reduced width of the conductive layer.

4. The switchable shunt of claim 2 wherein the reduced cross sectional area is formed by a reduced thickness of the conductive layer.

5. The switchable shunt of claim 1 wherein at least one of the leads includes an enlarged width planar region.

6. The switchable shunt of claim 5 wherein the enlarged width planar region is supported by at least one of the insulating layer and metal spring layer in a location where the lead is connected to the enlarged width planar region distal of the bridge.

7. The switchable shunt of claim 1 wherein each of the leads include an enlarged width planar region adjacent the bridge.

8. The switchable shunt of claim 7 further comprising a hinge area formed by a relief subjacent at least a center of the bridge, where the relief is characterized by the absence of at least one of the insulating layer and metal spring layer.

9. The switchable shunt of claim 8 wherein at least one of the enlarged planar regions is formed generally as a rectangle.

10. The switchable shunt of claim 9 wherein the at least one enlarged planar region is supported in three corners and is generally free of support in a corner proximal the bridge.

11. The switchable shunt of claim 10 wherein each of the enlarged planar regions is free of support in a corner proximal the bridge and where the corners free of support are on opposite lateral sides of the bridge.

12. The switchable shunt of claim 11 wherein the hinge area is generally a parallelogram circumscribing the bridge.

13. The switchable shunt of claim 1 wherein the leads are generally located in a plane and at least one of the overlapping ends of the bridge project out of the plane.

14. The switchable shunt of claim 1 wherein at least one of the overlapping ends of the bridge is elongated to provide the overlap.

15. The switchable shunt of claim 1 wherein a portion of at least one of the insulating layer and metal spring layer urge the overlapping ends together.

16. The switchable shunt of claim 1 wherein at least one of the overlapping ends is a cantilevered beam.

17. The switchable shunt of claim 16 wherein the cantilevered beam is supported by a corresponding portion of at least one of the insulating layer and metal spring layer.

18. The switchable shunt of claim 1 formed integrally with an electrical test pad for the head suspension.

19. The switchable shunt of claim 1 wherein the conductive layer is plated with a non-oxidizing conductive material at least in the region of the bridge.

* * * * *